US009562680B2

(12) United States Patent
Kang et al.

(10) Patent No.: US 9,562,680 B2
(45) Date of Patent: Feb. 7, 2017

(54) LIGHTING DEVICE

(71) Applicant: LG INNOTEK CO., LTD., Seoul (KR)

(72) Inventors: Seok Jin Kang, Seoul (KR); Tae Young Choi, Seoul (KR); Sungho Hong, Seoul (KR); Dong Soo Kim, Seoul (KR)

(73) Assignee: LG INNOTEK., LTD., Seoul (KR)

( * ) Notice: Subject to any disclaimer, the term of this patent is extended or adjusted under 35 U.S.C. 154(b) by 150 days.

(21) Appl. No.: 14/317,210

(22) Filed: Jun. 27, 2014

(65) Prior Publication Data

US 2014/0313732 A1  Oct. 23, 2014

Related U.S. Application Data

(63) Continuation of application No. 12/941,493, filed on Nov. 8, 2010, now Pat. No. 8,829,771.

(30) Foreign Application Priority Data

| Nov. 9, 2009 | (KR) | ......................... 10-2009-0107498 |
| Jan. 20, 2010 | (KR) | ......................... 10-2010-0005145 |
| Apr. 7, 2010 | (KR) | ......................... 10-2010-0032059 |
| Apr. 7, 2010 | (KR) | ......................... 10-2010-0032061 |
| Apr. 7, 2010 | (KR) | ......................... 10-2010-0032064 |
| Apr. 7, 2010 | (KR) | ......................... 10-2010-0032065 |

(51) Int. Cl.
*F21V 29/70* (2015.01)
*F21V 29/00* (2015.01)
*F21V 29/15* (2015.01)
*F21V 29/71* (2015.01)
*F21V 29/74* (2015.01)
(Continued)

(52) U.S. Cl.
CPC .................. *F21V 29/70* (2015.01); *F21K 9/23* (2016.08); *F21K 9/60* (2016.08); *F21V 29/004* (2013.01); *F21V 29/15* (2015.01); *F21V 29/713* (2015.01); *F21V 29/74* (2015.01); *F21V 29/83* (2015.01); *F21V 5/04* (2013.01); *F21V 7/04* (2013.01); *F21Y 2101/00* (2013.01);
(Continued)

(58) Field of Classification Search
CPC .............................. F21V 29/77; F21V 29/713
See application file for complete search history.

(56) References Cited

U.S. PATENT DOCUMENTS

| 5,632,551 A | 5/1997 | Roney et al. |
| 7,559,674 B2 | 7/2009 | He et al. .................. 362/249.02 |

(Continued)

FOREIGN PATENT DOCUMENTS

| CN | 2731263 | 10/2005 |
| CN | 1838855 A | 9/2006 |

(Continued)

OTHER PUBLICATIONS

Japanese Office Action dated Jul. 14, 2015 issued in Application No. 2014-229599.

(Continued)

*Primary Examiner* — Anh Mai
*Assistant Examiner* — Zachary J Snyder
(74) *Attorney, Agent, or Firm* — KED & Associates, LLP

(57) ABSTRACT

A lighting device includes a heat sink for dissipating heat from a light source. The heat sink is located between an inner case and an outer case, and a power controller is located in the inner case. The light source may include one or more light emitting diodes.

19 Claims, 26 Drawing Sheets

(51) Int. Cl.
*F21V 29/83* (2015.01)
*F21Y 105/00* (2016.01)
*F21V 5/04* (2006.01)
*F21V 7/04* (2006.01)
*F21Y 101/00* (2016.01)

(52) U.S. Cl.
CPC . *F21Y 2105/00* (2013.01); *H01L 2224/48091* (2013.01); *H01L 2924/181* (2013.01)

(56) References Cited

U.S. PATENT DOCUMENTS

| | | | |
|---|---|---|---|
| 8,471,443 B2 | 6/2013 | Choi et al. | |
| 8,829,771 B2 | 9/2014 | Kang et al. | |
| 2002/0004251 A1 | 1/2002 | Roberts et al. | 438/26 |
| 2004/0264135 A1 | 12/2004 | MacGregor | 361/704 |
| 2005/0218524 A1 | 10/2005 | Japp et al. | 257/762 |
| 2006/0193139 A1 | 8/2006 | Sun et al. | 362/373 |
| 2006/0227558 A1 | 10/2006 | Osawa et al. | 362/351 |
| 2006/0232974 A1 | 10/2006 | Lee et al. | |
| 2007/0041220 A1 | 2/2007 | Lynch | 362/646 |
| 2007/0109775 A1* | 5/2007 | Chen | F21L 4/027 362/187 |
| 2007/0133203 A1 | 6/2007 | Chen | 362/235 |
| 2007/0262337 A1 | 11/2007 | Villard | |
| 2007/0279906 A1 | 12/2007 | He et al. | 362/253 |
| 2008/0025028 A1 | 1/2008 | Gloisten et al. | 362/294 |
| 2008/0093998 A1 | 4/2008 | Dennery et al. | 315/246 |
| 2008/0112168 A1 | 5/2008 | Pickard et al. | |
| 2008/0157112 A1 | 7/2008 | He et al. | |
| 2008/0291677 A1 | 11/2008 | Chen | 362/249 |
| 2009/0067191 A1 | 3/2009 | Faber et al. | |
| 2009/0129102 A1* | 5/2009 | Xiao | F21K 9/00 362/373 |
| 2009/0141508 A1* | 6/2009 | Peng | F21V 23/02 362/373 |
| 2009/0166895 A1 | 7/2009 | Noguchi et al. | 257/786 |
| 2009/0237940 A1 | 9/2009 | Wu et al. | 362/280 |
| 2009/0242922 A1* | 10/2009 | Lin | F21V 31/005 257/99 |
| 2009/0244899 A1* | 10/2009 | Chyn | F21V 29/004 362/294 |
| 2009/0261707 A1 | 10/2009 | Liu et al. | 313/46 |
| 2010/0001309 A1 | 1/2010 | Wang et al. | 257/99 |
| 2010/0061098 A1 | 3/2010 | Horng et al. | 362/253 |
| 2010/0126697 A1* | 5/2010 | Huang | F21K 9/137 165/80.3 |

FOREIGN PATENT DOCUMENTS

| | | |
|---|---|---|
| CN | 1880844 A | 12/2006 |
| CN | 287655 | 3/2007 |
| CN | 2881340 Y | 3/2007 |
| CN | 200940796 Y | 8/2007 |
| CN | 201129629 Y | 10/2008 |
| CN | 101390191 A | 3/2009 |
| CN | 201221693 Y | 4/2009 |
| CN | 201237095 Y | 5/2009 |
| CN | 101454909 A | 6/2009 |
| CN | 201262382 Y | 6/2009 |
| CN | 101471316 A | 7/2009 |
| CN | 101471337 A | 7/2009 |
| CN | 101672432 A | 3/2010 |
| JP | 2002-025331 A | 1/2002 |
| JP | 2003-092022 A | 3/2003 |
| JP | 2004-161797 A | 6/2004 |
| JP | 2006-310057 | 11/2006 |
| JP | 2006-313731 A | 11/2006 |
| JP | 2006-331817 A | 12/2006 |
| JP | 2007-119589 A | 5/2007 |
| JP | 3136560 U | 10/2007 |
| JP | 2007-295007 A | 11/2007 |
| JP | 3142664 U | 6/2008 |
| JP | 2008-204671 A | 9/2008 |
| JP | 2009-004130 A | 1/2009 |
| JP | 2009-037995 A | 2/2009 |
| JP | 2009-093926 A | 4/2009 |
| JP | 2009-158872 A | 7/2009 |
| JP | 2009-163955 A | 7/2009 |
| JP | 2009-205017 A | 9/2009 |
| JP | 2009-206104 A | 9/2009 |
| KR | 10-0496522 B1 | 6/2005 |
| KR | 10-2006-0028374 A | 3/2006 |
| KR | 10-2008-0088890 A | 10/2008 |
| KR | 10-2009-0012385 A | 2/2009 |
| KR | 10-2009-0046120 A | 5/2009 |
| KR | 10-2009-0066262 A | 6/2009 |
| KR | 10-2009-0072768 A | 7/2009 |
| KR | 10-2009-0095903 A | 9/2009 |
| KR | 20-2009-0009585 U | 9/2009 |
| KR | 10-2009-0119287 A | 11/2009 |
| KR | 10-2010-0002663 A | 1/2010 |
| TW | M340561 U | 9/2008 |
| TW | M350675 U | 2/2009 |
| TW | M352635 U | 3/2009 |
| WO | WO 2007/139195 A1 | 12/2007 |
| WO | WO 2008/025161 A1 | 3/2008 |
| WO | WO 2008/123670 | 10/2008 |
| WO | WO 2009/044716 A1 | 4/2009 |

OTHER PUBLICATIONS

Japanese Decision of Dismissal of Amendment issued in Application No. 2010-251030 dated Oct. 28, 2014 (with English translation).
Korean Office Action dated Apr. 14, 2011 issued in Application No. 10-2010-0005145.
Korean Notice of Allowance dated Oct. 13, 2011 issued in Application No. 10-2010-0032065.
United States Office Action dated Jul. 7, 2011 issued in U.S. Appl. No. 12/941,507.
United States Office Action dated Dec. 14, 2011 issued in U.S. Appl. No. 12/941,507.
United States Office Action dated Dec. 22, 2011 issued in U.S. Appl. No. 12/941,493.
Partial European Search Report dated Mar. 14, 2012 issued in Application No. 10190506.5/2320133.
Partial European Search Report dated Mar. 14, 2012 issued in Application No. 10190506.5/2320134.
United States Office Action dated Jul. 9, 2012 issued in U.S. Appl. No. 12/941,507.
United States Office Action dated Sep. 5, 2012 issued in U.S. Appl. No. 12/941,493.
Chinese Office Action dated Sep. 28, 2012 issued in Application No. 201010610979.6 (with English translation).
Chinese Office Acted dated Dec. 17, 2012 issued in Application No. 201010611024.2 (with English translation).
Chinese Office Action dated Dec. 28, 2012 issued in Application No. 201010621767.8 (with English translation).
Taiwanese Office Action dated May 14, 2013 issued in Application No. 099138565.
Taiwanese Office Action dated Jan. 28, 2014 issued in Application No. 099138563.
Japanese Office Action dated Feb. 20, 2014 issued in Application No. 2010-251024.
Japanese Office Action dated Mar. 10, 2014 issued in Application No. 2010-251030.
Japanese Office Action dated Apr. 1, 2014 issued in Application No. 2010-251034.
European Search Report issued in Application No. 15158936.3 dated Jun. 10, 2015.
Chinese Office Action dated May 13, 2014 issued in Application No. 201010610979.6 (with English translation).
Chinese Office Action dated May 12, 2016 issued in Application No. 201510015106.3 (with English Translation).

* cited by examiner

LIGHTING DEVICE

CROSS-REFERENCE TO RELATED APPLICATIONS

This application is a Continuation application of prior U.S. patent application Ser. No. 12/941,493 filed Nov. 8, 2010, which claims priority under 35 U.S.C. §119 to Korean Application Nos. 10-2009-0107498 filed on Nov. 9, 2009, 10-2010-0005145 filed on Jan. 20, 2010, 10-2010-0032059, 10-2010-0032061, 10-2010-0032064 and 10-2010-0033065 filed on Apr. 7, 2010, whose entire disclosures are hereby incorporated by reference.

BACKGROUND

Field

This embodiment relates to a lighting device.

Description of the Related Art

A light emitting diode (hereinafter, referred to as LED) is a semiconductor element for converting electric energy into light. An electric bulb has a short life span. A longer time for use of the electric bulb causes the life span to be shorter. For this reason, the electric bulb is required to check and change cyclically. Therefore, there has been a problem of paying for the additional cost of changing and managing the electric bulb. As compared with existing light sources such as a fluorescent lamp and an incandescent electric lamp and so on, the LED has advantages of low power consumption, a semi-permanent span of life, a rapid response speed, safety and an environment-friendliness. Therefore, many researches are devoted to substitution of the existing light sources with the LED. The LED is used as a light source for lighting devices, for example, various lamps used interiorly and exteriorly, a liquid crystal display device, an electric sign and a street lamp and the like, as a result, is now increasingly taking the place of the electric bulb. However, since the LED tends to be vulnerable to heat generated from its operation, most of LED lighting devices are employing various means for efficiently radiating heat. In the publication of Korean patent application No. 10-2009-0130473, a power LED module for a street lamp is disclosed, which radiates high heat through a heat radiating plate and so on. A heat radiating body having a heat radiating fin formed therein is used in the conventional technology disclosed in the publication of Korean patent application No. 10-2009-009831.

SUMMARY

One embodiment is a lighting device. The lighting device comprises: a heat radiating body comprising a base, a first body extended downward from the base, a second body extended upward from the base, and a plurality of heat radiating fins extended from the first body and the second body; a light source disposed on the base and received in the first body; and a power supply controller received in the second body and connected electrically to the light source, wherein each of the heat radiating fins has a shape of a circular arc bent perpendicular to a longitudinal direction of the heat radiating body.

Another embodiment is a lighting device. The lighting device comprises: a heat radiating body comprising a base, a first body extended downward from the base and a second body extended upward from the base; a light source disposed on the base and received in the first body; an inner case comprising an inner body received in the second body and a guide extended outward from the inner body; a power supply controller received in the inner body of the inner case and connected electrically to the light source; an outer case comprising an outer wall surrounding the heat radiating body, wherein the outer case has a hole communicated with a space formed between the outer wall and the heat radiating body.

Further another embodiment is a lighting device. The lighting device comprises: a heat radiating body comprising a base, a first body extended downward from the base and a second body extended upward from the base; a substrate disposed on the base and received in the first body; a plurality of light emitting devices disposed on the substrate; a sealing ring received in the first body and disposed between an edge part of the substrate and the first body; and a guide member covering the first body of the heat radiating body, wherein the guide member supports the sealing ring in order to fix the substrate to the base of heat radiating body.

DETAILED DESCRIPTION OF THE EMBODIMENTS

Hereinafter, an embodiment will be described in detail with reference to the accompanying drawings.

It will be understood that when an element is referred to as being 'on' or "under" another element, it can be directly on/under the element, and one or more intervening elements may also be present.

In describing embodiments, if there is no particular standard for the "top" or "bottom" of each layer, it is assumed that a side where a light source 130 is disposed is the "top" and a side where a terminal 175 is disposed is the "bottom". However, in FIGS. 11 and 12, a surface on which a light emitting device 131 is formed is assumed to be an upper surface. The thickness or size of each layer is exaggerated, omitted or schematically shown in the figures, for the convenience and clarity of description. Further, the size of each component does not necessarily represent its actual size.

Figure 1:
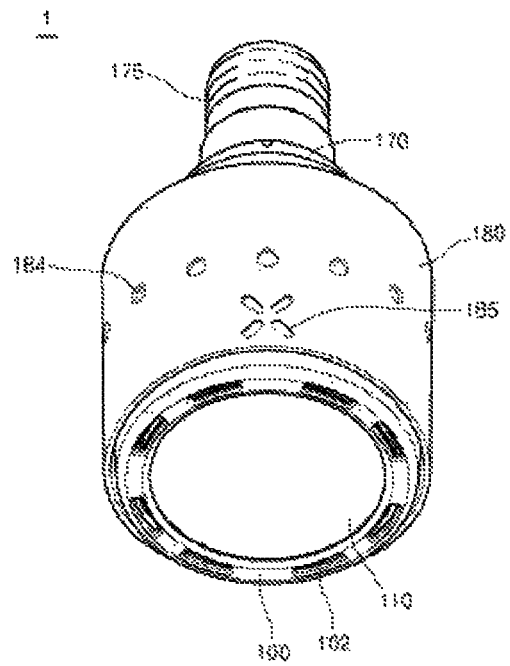
FIG. 1 is a bottom perspective view of a lighting device according to an embodiment of the present invention.
Figure 2:
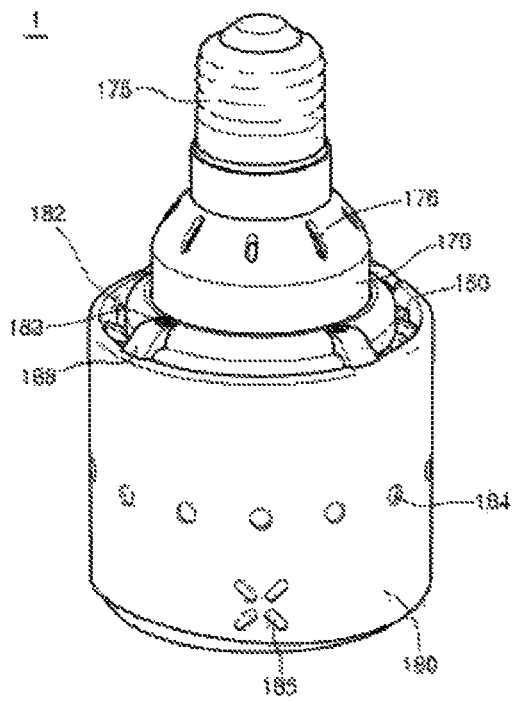
FIG. 2 is a top perspective view of the lighting device of FIG. 1.
Figure 3:
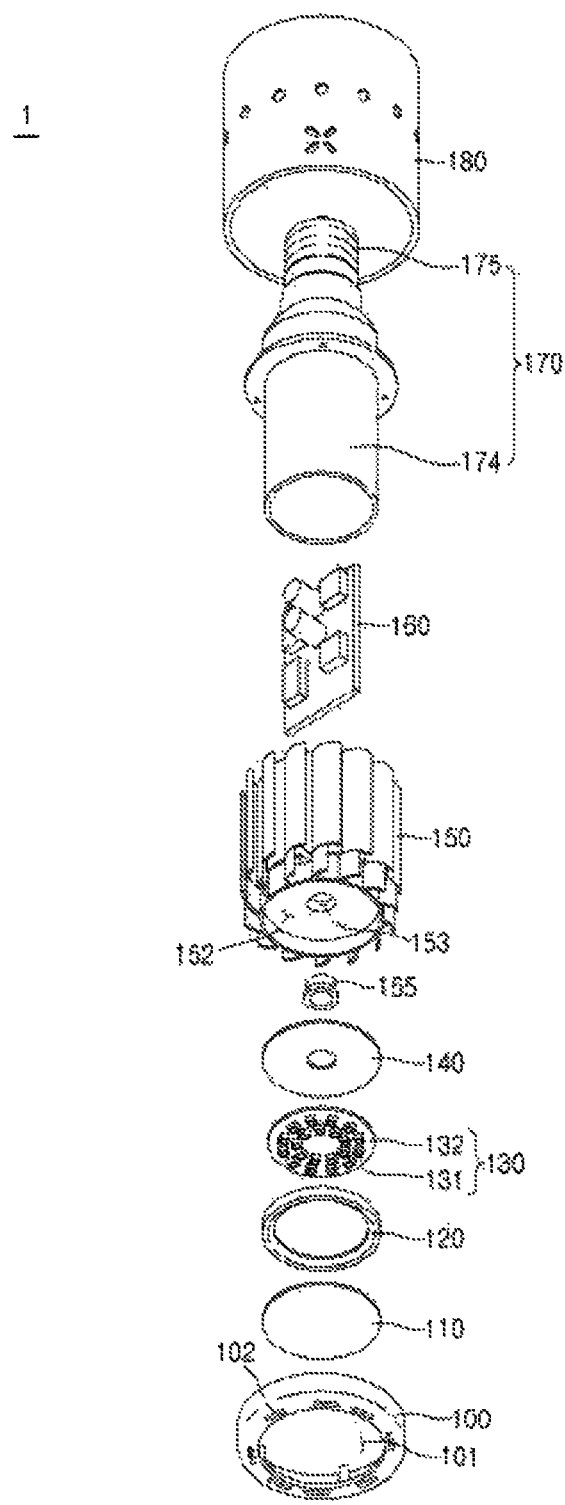
FIG. 3 is an exploded perspective view of the lighting device of FIG. 1.
Figure 4:
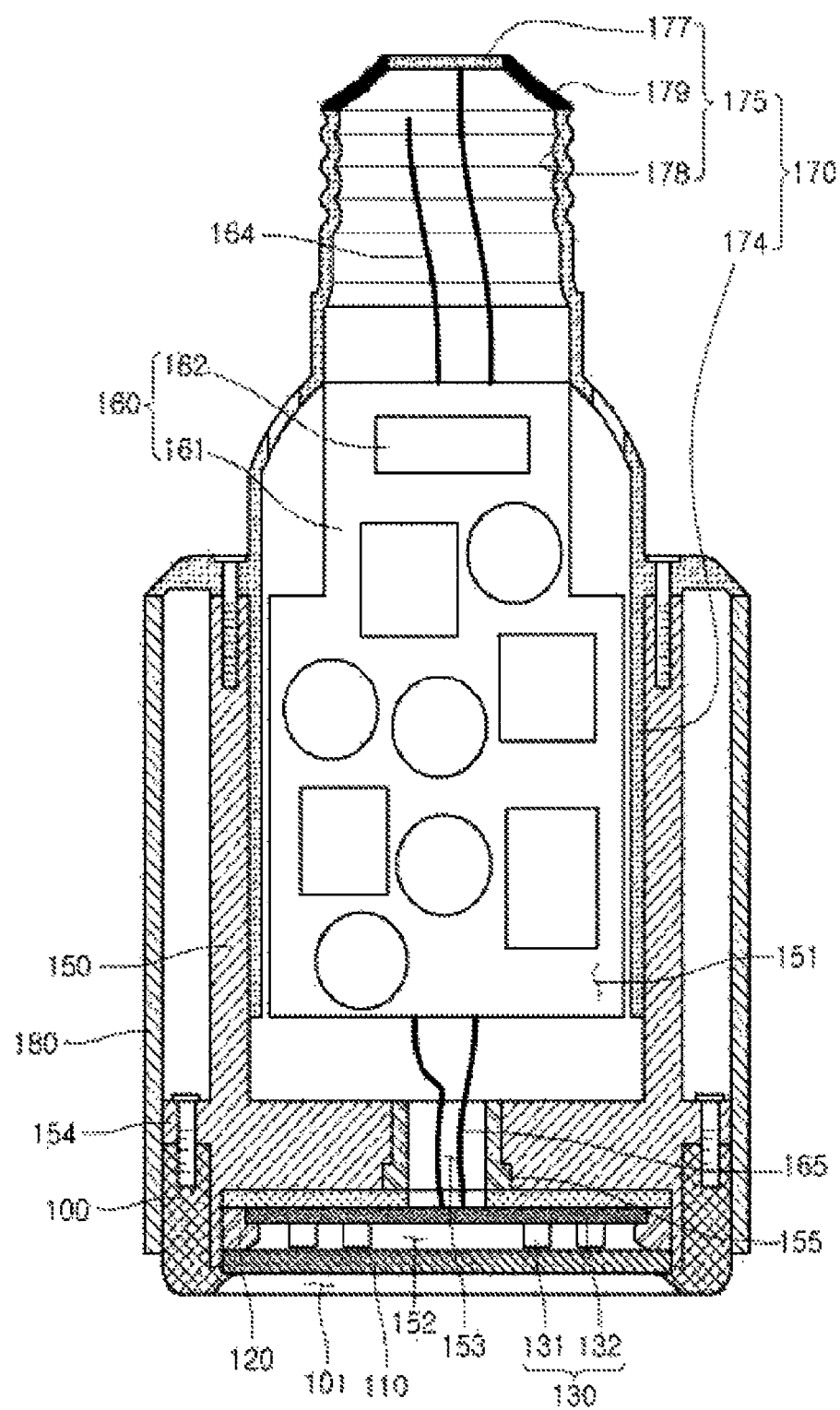
FIG. 4 is a longitudinal cross sectional view of the lighting device of FIG. 1.

FIG. 1 is a bottom perspective view of a lighting device 1 according to an embodiment of the present invention. FIG. 2 is a top perspective view of the lighting device 1 of FIG. 1. FIG. 3 is an exploded perspective view of the lighting device 1 of FIG. 1. FIG. 4 is a longitudinal cross sectional view of the lighting device 1 of FIG. 1.

Referring to FIGS. 1 to 4, the lighting device 1 includes a guide member 100, a lens 110, a sealing ring 120, a light source 130, a heat radiating plate 140, a heat radiating body 150, a power supply controller 160, an inner case 170 and an outer case 180.

Hereinafter, each component of the light device 1 according to an embodiment of the present invention will be described in detail. Moreover, a principle of obtaining an excellent heat radiation efficiency of the light device 1 according to an embodiment of the present invention will be described as well.

Heat Radiating Body 150

Figure 5:
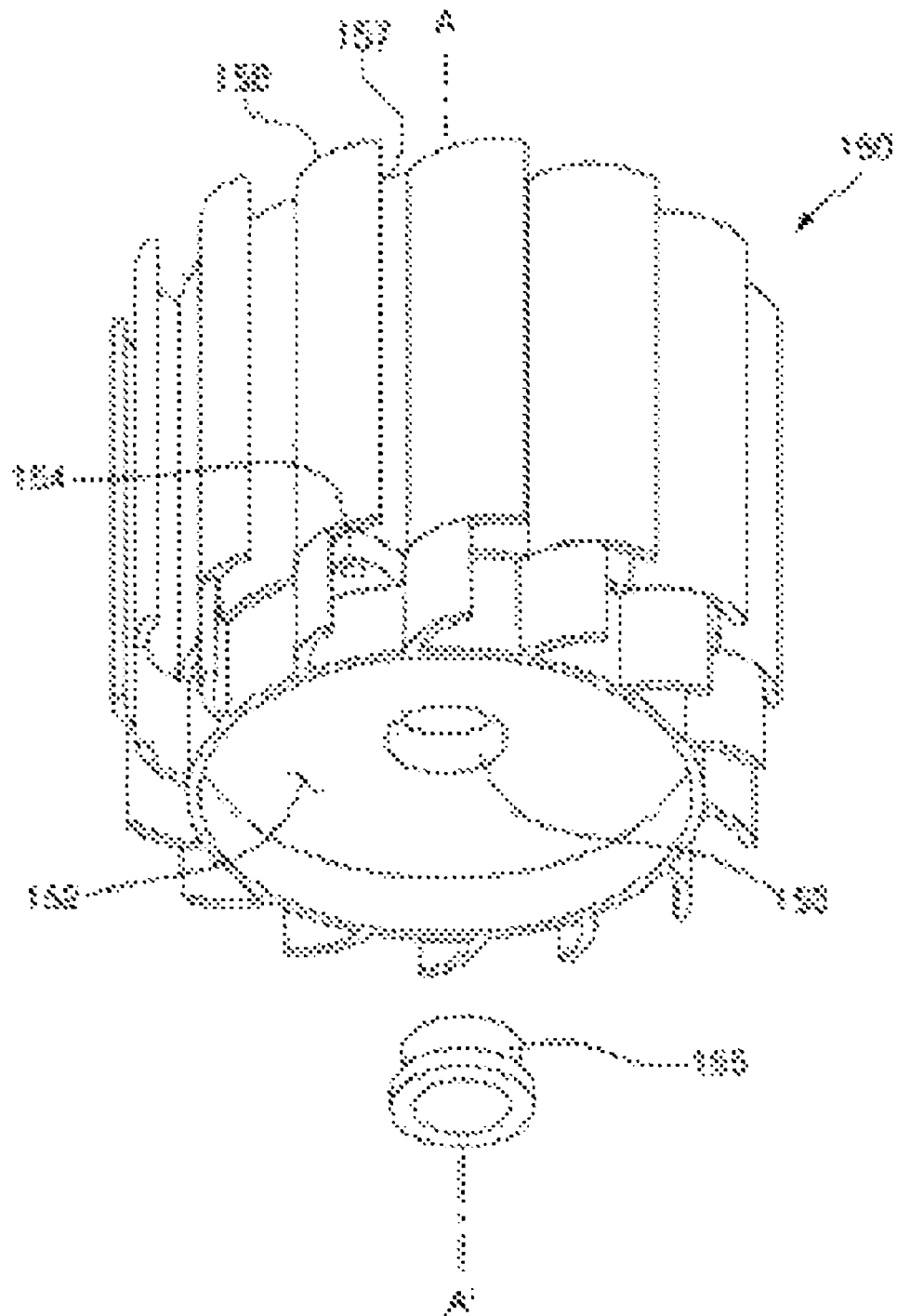
FIG. 5 is a bottom perspective view of a heat radiating body 150 of the lighting device of FIG. 1.
Figure 6:
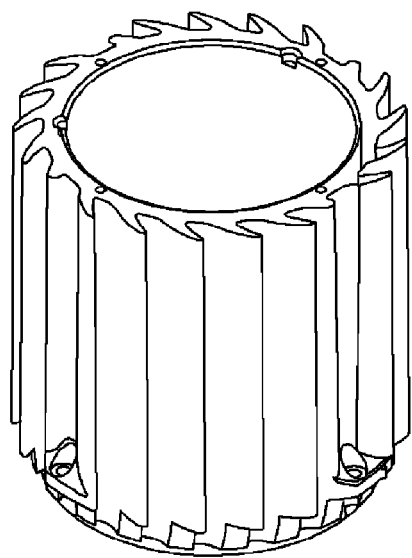
FIG. 6 is a top perspective view of a heat radiating body 150 of the lighting device of FIG. 1.
Figure 7:
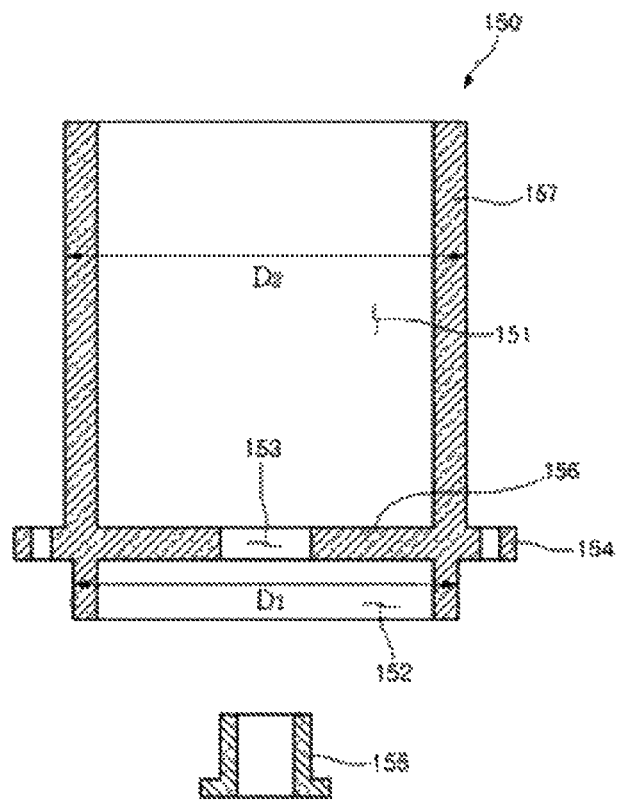
FIG. 7 is a cross sectional view taken along a line A-A' of FIG. 5.

FIG. 5 is a bottom perspective view of a heat radiating body 150 of the lighting device of FIG. 1. FIG. 6 is a top perspective view of a heat radiating body 150. FIG. 7 is a cross sectional view taken along a line A-A' of FIG. 5.

Referring to FIGS. 4 to 7, the heat radiating body 150 includes a base 156 having a through hole 153, a cylindrical body 157 extending perpendicular to the base 156 and a heat radiating fin 158 formed on the outer peripheral surface of the body 157.

Figure 13:
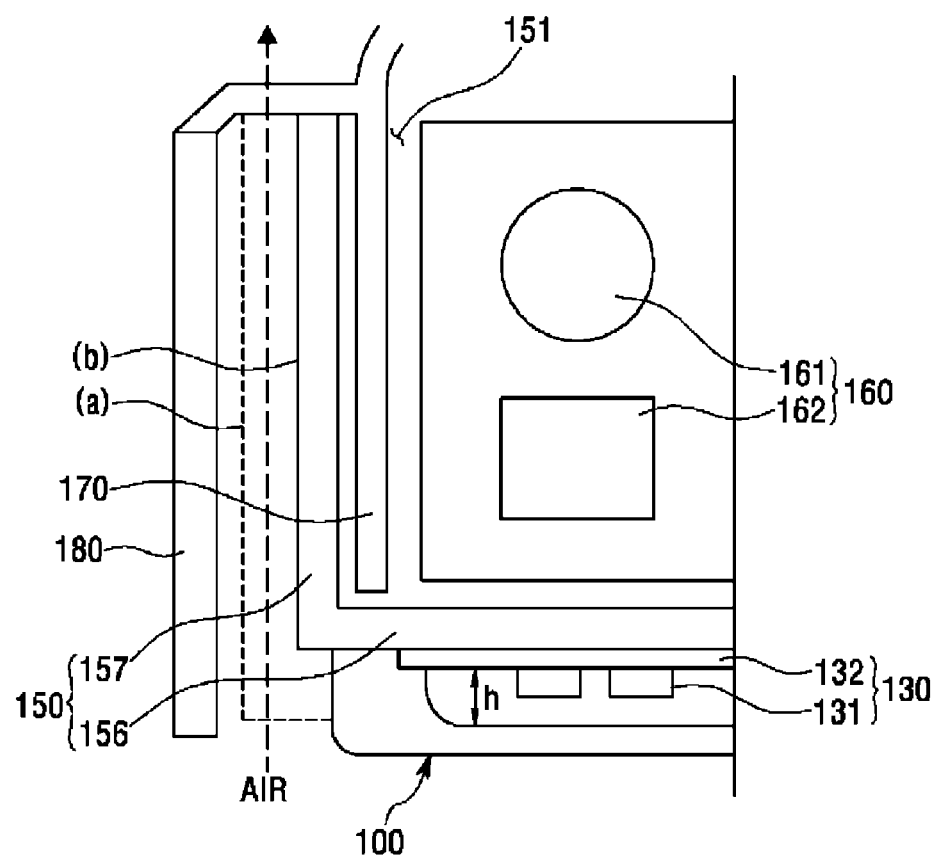
FIG. 13 is a view showing a left side of a longitudinal section of a lighting device without a sealing ring.

The heat radiating body 150 receives the light source 130 and the power supply controller 160 and radiates heat generated from the light source 130 and/or the power supply controller 160. A first receiving groove 151 on which the power supply controller is disposed is formed on the upper surface of the heat radiating body 150. A second receiving groove 152 on which the light source 130 is disposed is formed on the lower surface of the heat radiating body 150. Here, while the first receiving groove 151 is absolutely required for receiving and disposing the power supply controller 160, the second receiving groove 152 is not necessarily formed as shown in FIG. 13. In this case, the light source 130 is disposed contacting with or close to the lower surface of the heat radiating body 150. The width and depth of the receiving grooves 151 and 152 are changeable depending on the width and thickness of the power supply controller 160 and the light source 130.

Referring to FIGS. 5 and 6, at least one heat radiating fin 158 is disposed separately from each other at a predetermined interval on the outer peripheral surface of the body 157. Each heat radiating fin 158 has its predetermined width as viewed from the top or bottom of the heat radiating body 150. The heat radiating fin 158 has a board shape as viewed from the side of the heat radiating body 150 and is formed in the direction of length of the body 157. The heat radiating fin 158 as viewed from the top or bottom of the heat radiating body 150 looks like a saw-tooth shape or seems to have an uneven structure formed having a regular interval along the outer peripheral surface of the body 157 of the heat radiating body 150. More preferably, as the heat radiating body 150 is shown in FIGS. 5 to 10, the heat radiating fin 158 may have a shape of a circular arc bent perpendicular to the longitudinal direction of the heat radiating body 150 so as to increase the heat radiation efficiency by increasing a contact area with the air. Also preferably, heat radiating fin 158 can have a shape of a sine curve along the direction perpendicular to the longitudinal direction of the heat radiating body 150 (not shown). Such a heat radiating fin 158 causes the surface area of the heat radiating body 150 to be increased, improving the heat radiation efficiency.

If the number of the heat radiating fin 158 is increased, the contact area with the air is increased. Therefore, the heat radiation efficiency is improved. On the contrary, manufacturing cost is higher and structural vulnerability is generated. Since a heating value is variable according to a power capacity of the lighting device, it is necessary to determine an appropriate number of the heat radiating fin 158.

Figure 8:
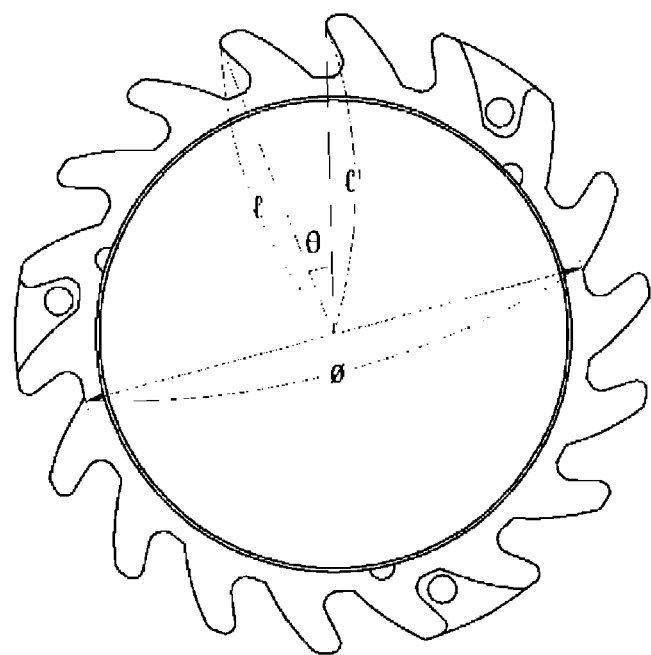
FIG. 8 is a plan view of a heat radiating body used in a lighting device consuming an electric power of 3.5 W.
Figure 10:
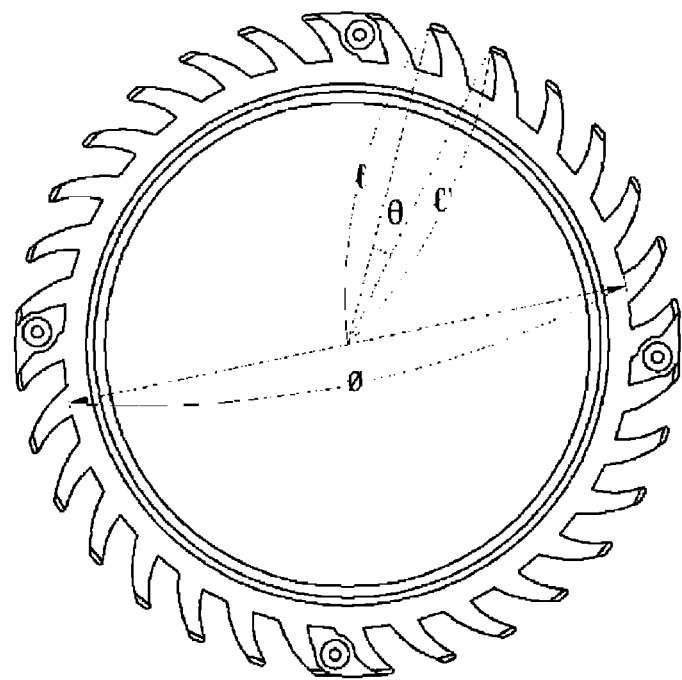
FIG. 10 is a plan view of a heat radiating body used in a lighting device consuming an electric power of 15 W.

The heat radiating body 150 of which the body 157 has a circular section as viewed from the top will be described. Referring to FIGS. 8 and 10, it is assumed that a line extending from an outermost end to a center of the body 157 is denoted by l, a line extending from an adjacent heat radiating fin 158 to the center of the body 157 is denoted by 'l', an acute angle between l and l' is denoted by θ, and an outer diameter of the body 157 is denoted by ø. When a lighting device consuming an electric power of 3.5 W has a case where θ is 20ø is 35.30 mm, the number of the heat radiating fins 158 is 18, an interval between the heat radiating fins 158 is 3.59 mm and a thickness of a part of each heat radiating fin 158 contacting with the body 157 is 3.59 mm, and when a lighting device consuming an electric power of 5 W or 8 W has a case where θ is 17.14285ø is 55.00 mm, the number of the heat radiating fins 158 is 21, an interval between the heat radiating fins 158 is 2.77 mm and a thickness of a part of each heat radiating fin 158 contacting with the body 157 is 3.77 mm, and when a lighting device consuming an electric power of 15 W has a case where θ is 11.235ø is 77.00 mm, the number of the heat radiating fins 158 is 32, an interval between the heat radiating fins 158 is 3.65 mm and a thickness of a part of each heat radiating fin 158 contacting with the body 157 is 3.90 mm, it is possible to reduce the manufacturing cost and obtain an excellent heat radiation efficiency. Here, said numerical values are changeable depending on rigidity, a bursting strength, thermal properties, processability, etc., of the material of the heat radiating body 150.

The heat radiating body 150 is made of a metallic material or a resin material which has excellent heat radiation efficiency. For example, the heat radiating body 150 is made of Fe, Al, Ni, Cu, Ag, Sn and Mg, etc., and is also made of an alloy including at least one of Fe, Al, Ni, Cu, Ag, Sn and Mg, etc. Carbon steel and stainless steel can be also adopted. An anti-corrosion coating or an insulation coating may be performed on the surface of the heat radiating body 150 within a range without affecting a thermal conductivity.

Referring to FIGS. 4 and 5, the through hole 153 is formed on the bottom surface of the heat radiating body 150. The light source 130 is electrically connected to the power supply controller 160 by a second wiring 165 penetrating the through hole 153. Preferably, a protection ring 155 is added to the through hole 153. The protection ring 155 prevents moisture and impurities from penetrating between the light source 130 and the heat radiating body 150, prevents an electrical short-circuit, EMI, EMS and so on caused by contacting the second wiring 165 with heat radiating body 150 and improves a withstand voltage characteristic. The protection ring 155 is made of a rubber material, a resin material, a silicon material or other electrical insulating material.

Referring to FIGS. 5 and 6, a fastening member 154 is formed on the lateral surface of the lower part of the heat radiating body 150 such that the guide member 100 is securely coupled to the heat radiating body 150. The fastening member 154 has a hole for inserting a screw or a pinhole for a pin-coupling, thereby coupling strongly the guide member 100 to the heat radiating body 150 by using the screw or a pin.

Referring to FIG. 7, to make the guide member 100 coupled easily to the heat radiating body 150, a first width D1 of the lower part of the heat radiating body 150 is less than a second width D2 of the other part of the heat radiating body 150.

Figure 14:
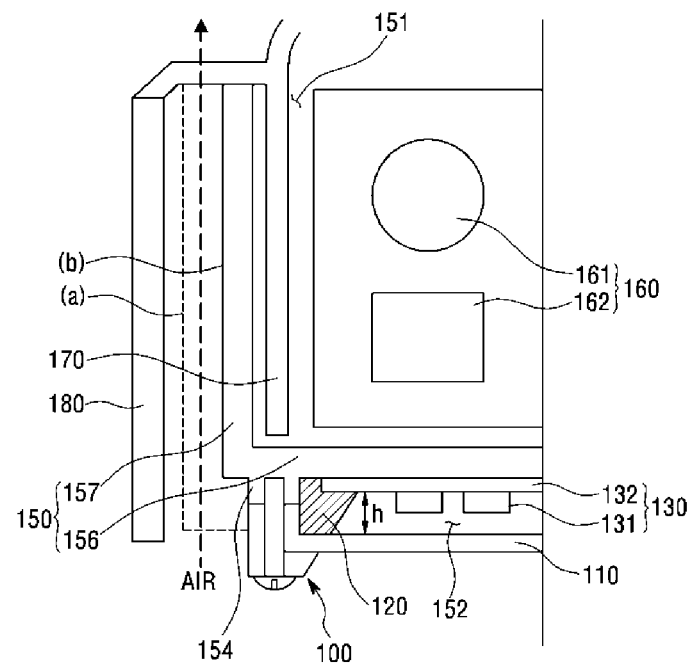
FIG. 14 is a view showing a left side of a longitudinal section of a lighting device having a fastening member formed on the lower surface of a base of a heat radiating body.

Referring to FIGS. 7 and 14, the first fastening member 154 is formed on the lower surface of the base 156 of the heat radiating body 150.

Light Source 130 and Sealing Ring 120

Figure 11:
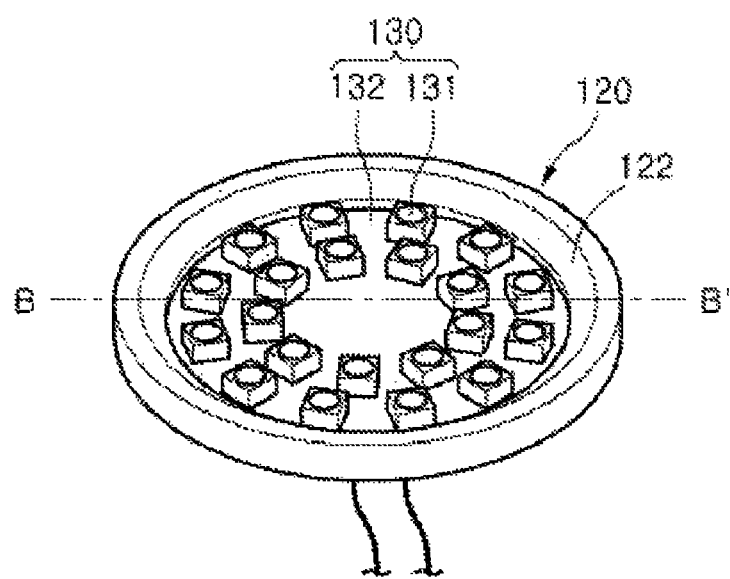
FIG. 11 is a perspective view showing coupling of a light source 130 and a sealing ring of the lighting device of FIG. 1.
Figure 12:
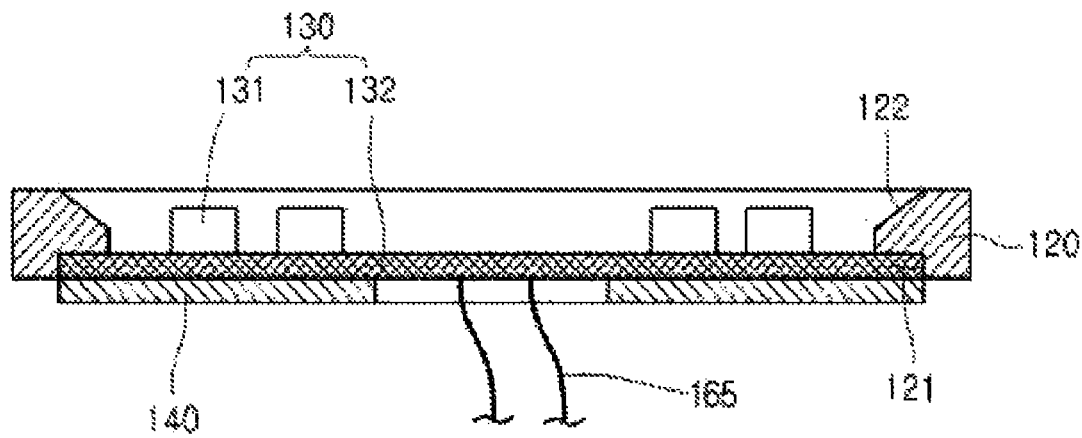
FIG. 12 is a cross sectional view taken along a line B-B' of FIG. 11.

FIG. 11 is a perspective view showing coupling of a light source 130 and a sealing ring of the lighting device of FIG. 1. FIG. 12 is a cross sectional view taken along a line B-B' of FIG. 11. It is assumed that a surface on which the light emitting device 131 is formed is an upper surface in FIGS. 11 and 12.

The light source 130 includes a substrate 132 and at least one light emitting device 131 mounted on the substrate 132.

The substrate 132 is made by printing a circuit pattern on an insulator. For example, a common printed circuit board (PCB), a metal core PCB, a flexible PCB and a ceramic PCB and the like can be used as the substrate 132.

The substrate 132 is made of a material capable of efficiently reflecting light. White and silver colors, etc., capable of efficiently reflecting light is formed on the surface of the substrate 132.

At least one light emitting device 131 is mounted on the substrate 132. Each of a plurality of the light emitting devices 131 includes at least one light emitting diode (hereinafter, referred to as LED). The LEDs include various colors such as red, green, blue and white, each of which emits red, green, blue and white lights respectively.

Meanwhile, there is no limit in disposing one or more light emitting devices 131. In the embodiment, however, while the lower surface of the substrate 132 includes an area to which the second wiring 165 is attached, the light emitting device 131 is not necessarily mounted on an area of the upper surface of the substrate 132, and the area of the upper surface corresponds to the area to which the second wiring 165 is attached. For example, in the embodiment shown in FIGS. 11 and 12, while the second wiring 165 is attached to the center of the lower surface of the substrate 132, the light emitting device 131 is not mounted on the center of the upper surface of the substrate 132, and the center of the upper surface corresponds to the center to which the second wiring 165 is attached. The light emitting device 131 is mounted on an area other than the center.

Referring to FIGS. 4, 12 to 15, the light source 130 is disposed in the receiving groove 152 of the heat radiating body 150. If the receiving groove 152 is not formed in the heat radiating body 150, the light source 130 is fixed strongly to the lower surface of the heat radiating body 150 by the guide member 100. A sealing ring 120 is coupled around the light source 130.

The sealing ring 120 prevents moisture and impurities from penetrating between the guide member 100 and the light source 130 and causes the outer lateral surface of the light source 130 and the second receiving groove 152 of the heat radiating body 150 to be spaced from each other so that light source 130 cannot directly contact with the heat radiating body 150. As a result, an electrical short-circuit, EMI, EMS and so on of the lighting device 1 are prevented and a withstand voltage characteristic is enhanced.

The sealing ring 120 is made of a rubber material, a resin material, a silicon material or other electrical insulating material and is coupled around the light source 130. Specifically, as shown in FIG. 12, a diameter difference 121 is generated in the inner lower part of the sealing ring 120. The lateral surface and the circumference of the upper surface of the light source 130 are in contact with the sealing ring 120 having the diameter difference 121. A slope 122 is formed in the inner upper part of the sealing ring 120 such that light distribution of the light source 130 is improved.

The sealing ring 120 strongly fixes and protects the light source 130, improving the reliability of the lighting device 1.

Figure 15:
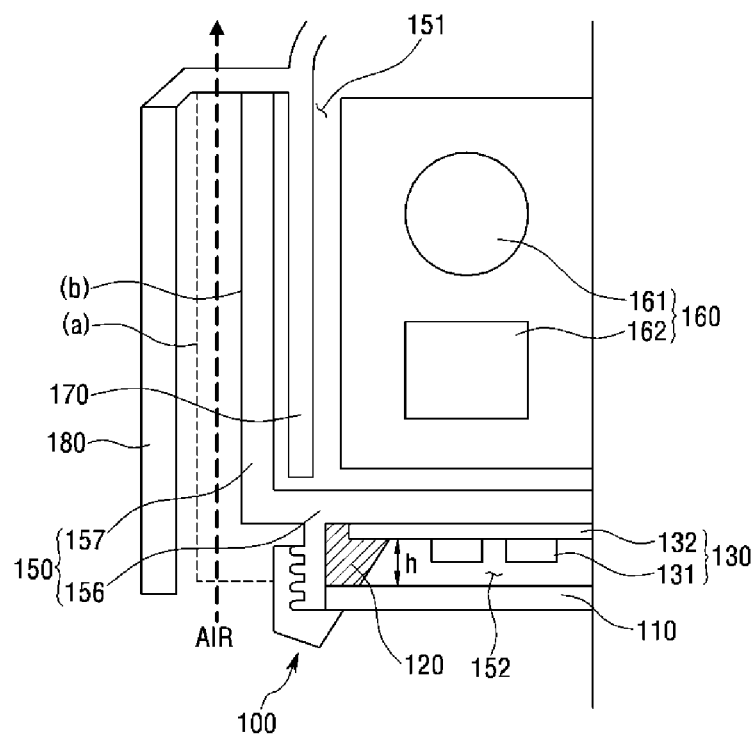
FIG. 15 is a view showing a left side of a longitudinal section of a lighting device having a heat radiating body and a guide member which are coupled without a pin or a screw.

Referring to FIGS. 14 and 15, when a lens 110 is disposed on the sealing ring 120, the sealing ring 120 allows the lens 110 to be disposed apart from the light source 130 by a first distance "h". As a result, it is much easier to adjust the light distribution of the lighting device 1.

Heat Radiating Plate 140

Referring to FIG. 12, a heat radiating plate 140 is attached to an opposite surface to the surface on which the light emitting device 131 of the light source 130 is disposed. The heat radiating plate 140 is attached to the receiving groove 152 as shown in FIG. 7. If the receiving groove 152 is not formed in the heat radiating body 150, the heat radiating plate 140 is disposed close to the lower surface of the heat radiating body 150. The light source 130 is integrally formed with the heat radiating plate 140.

The heat radiating plate 140 is made of a material having a high thermal conductivity such as a thermal conduction silicon pad or a thermal conduction tape and the like. The heat radiating plate 140 functions basically to transfer heat generated from the light source 130 to the heat radiating body 150. Moreover, in the embodiment, the heat radiating plate 140 is made of an insulating material, thereby preventing an electrical short-circuit, EMI, EMS and so on caused by contacting the light source 130 with heat radiating body 150 and improving a withstand voltage characteristic.

Guide Member 100

Figure 16:
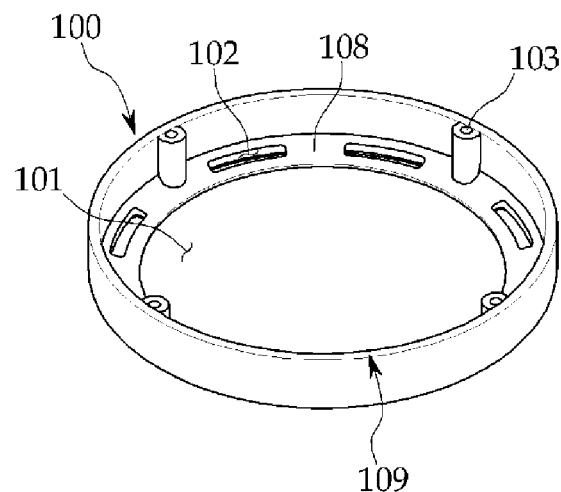
FIG. 16 is a perspective view of a guide member 100 of the lighting device of FIG. 1.
Figure 17:
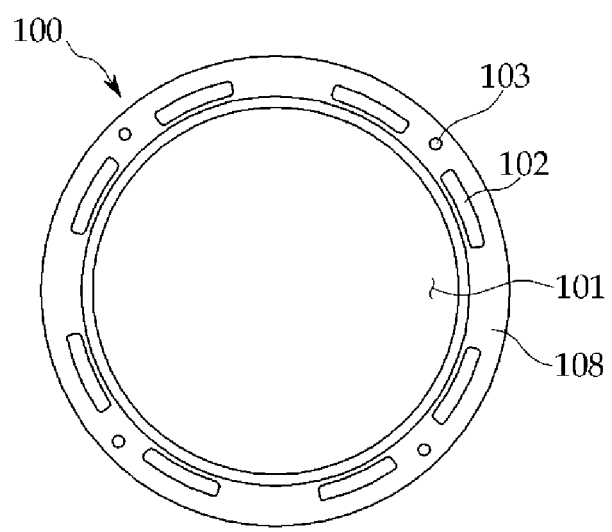
FIG. 17 is a bottom view of the guide member 100 of FIG. 16.

FIG. 16 is a perspective view of a guide member 100 of the lighting device of FIG. 1. FIG. 17 is a bottom view of the guide member 100 of FIG. 16.

In FIGS. 4, 16 and 17, the guide member 100 includes a base 108 having an opening 101 for allowing light radiated from the light source 130 to be seen through the lower part of the lighting device 1, a cover 109 extending perpendicular to the base 108, at least one first heat radiating hole 102 in either the base 108 or the cover 109, and a locking groove 103 for coupling the guide member 100 to the heat radiating body 150.

Even though the guide member 100 is shown in the form of a circular ring, the guide member 100 can have also shapes such as a polygon and an elliptical ring.

At least the heat radiating hole 102 performs a function as an air inlet for allowing the air to flow to the inside of the lighting device 1. However, referring to the embodiments shown in FIGS. 39 and 40, regardless of the fact that the guide member 100 includes the first heat radiating hole 102, external air flows into a space partitioned between the outer case 180 and the outermost end of the heat radiating body 150 along the broken-lined arrow, and then flows to the outside of the lighting device 1.

Figure 18:
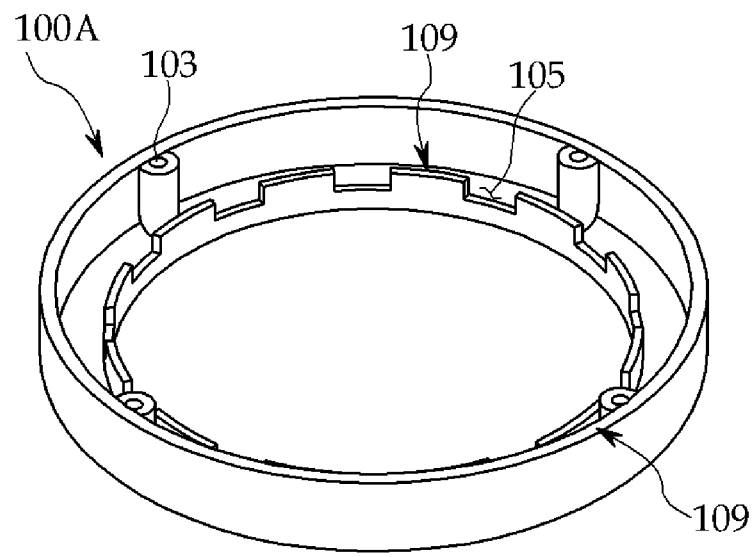
FIG. 18 is a perspective view of a guide member 100A of the lighting device of FIG. 1 in accordance with another embodiment of the present invention.
Figure 19:
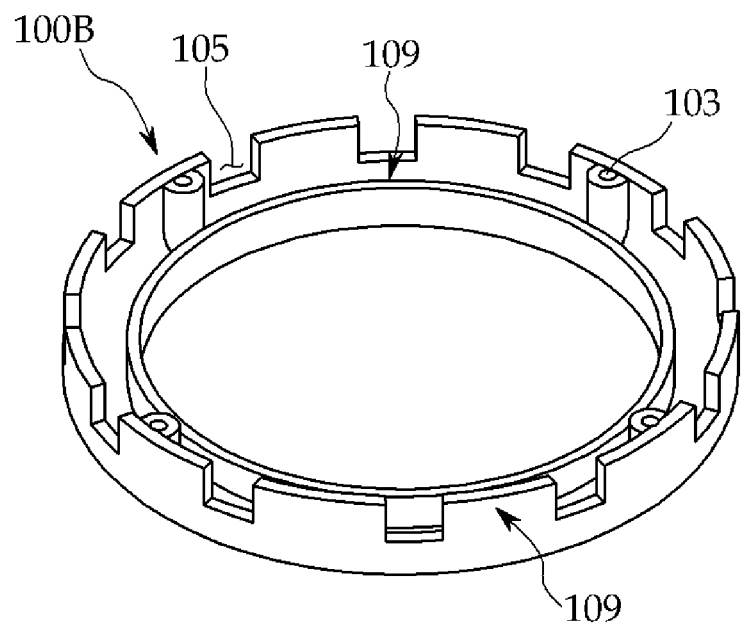
FIG. 19 is a perspective view of a guide member 100B of the lighting device of FIG. 1 in accordance with further another embodiment of the present invention.

The air flow structure of the guide member 100 is not limited to this and can be changed variously. For example, in guide members 100A and 100B shown in FIGS. 18 and 19, at least one of inner and outer covers 109 has at least one heat radiating groove 105 so that the air flows through the heat radiating groove 105.

Figure 20:
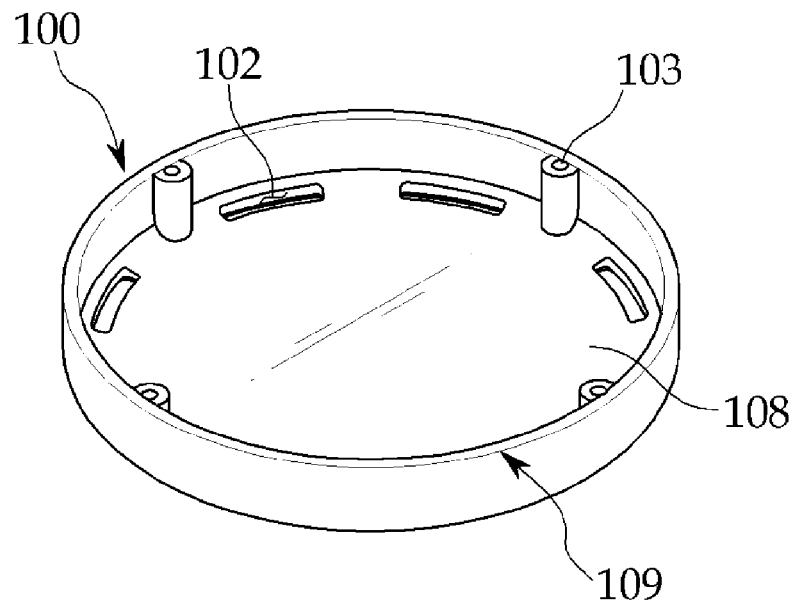
FIG. 20 is a view showing a modified embodiment of a transparent cover of the guide member 100 of FIG. 16.
Figure 21:
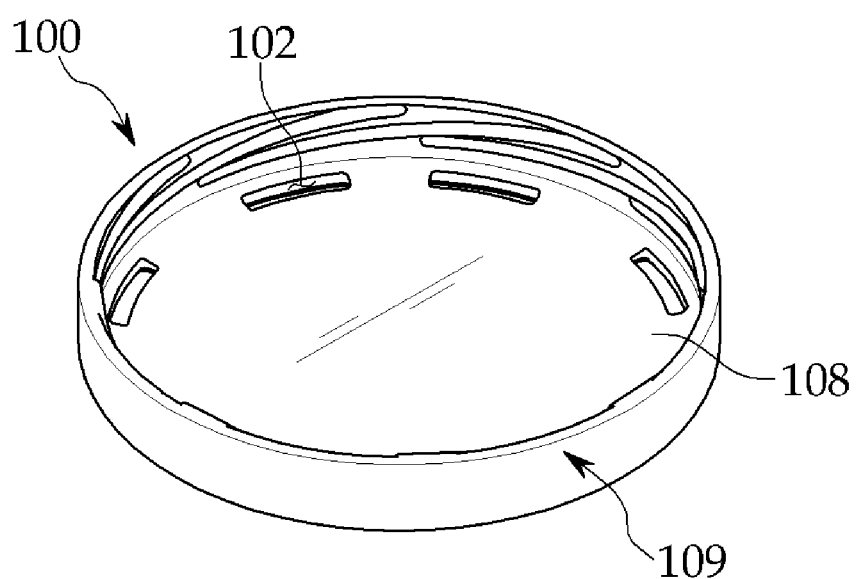
FIG. 21 is a view showing another modified embodiment of a transparent cover of the guide member 100 of FIG. 16.
Figure 22:
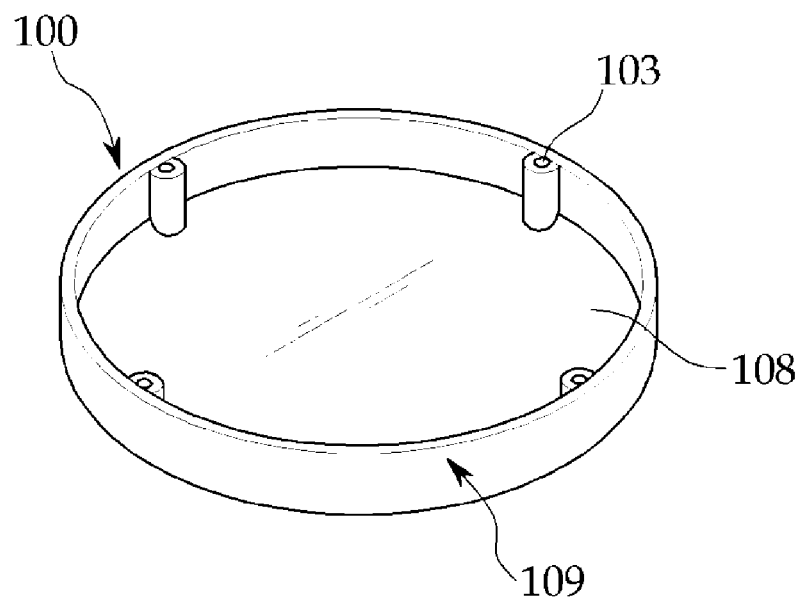
FIG. 22 is a view showing further another modified embodiment of a transparent cover of the guide member 100 of FIG. 16.
Figure 23:
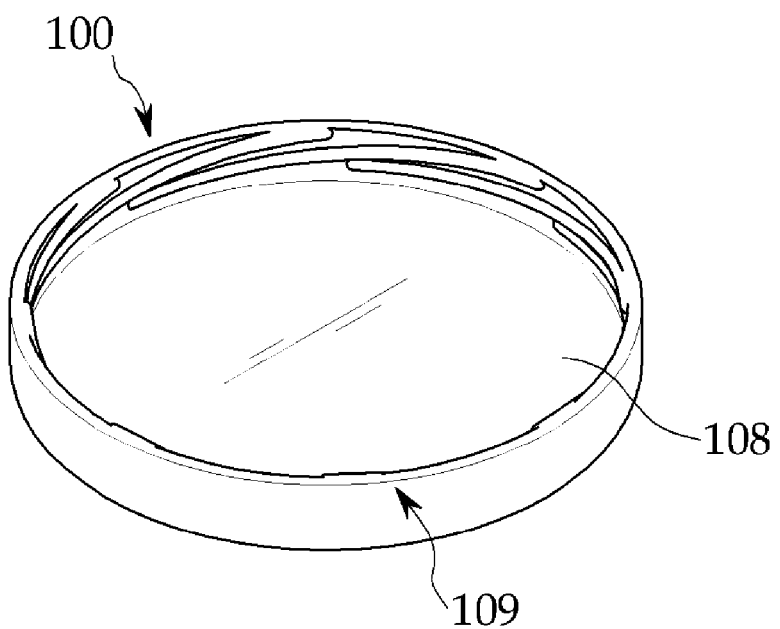
FIG. 23 is a view showing yet another modified embodiment of the transparent cover of the guide member 100 of FIG. 16.
Figure 24:
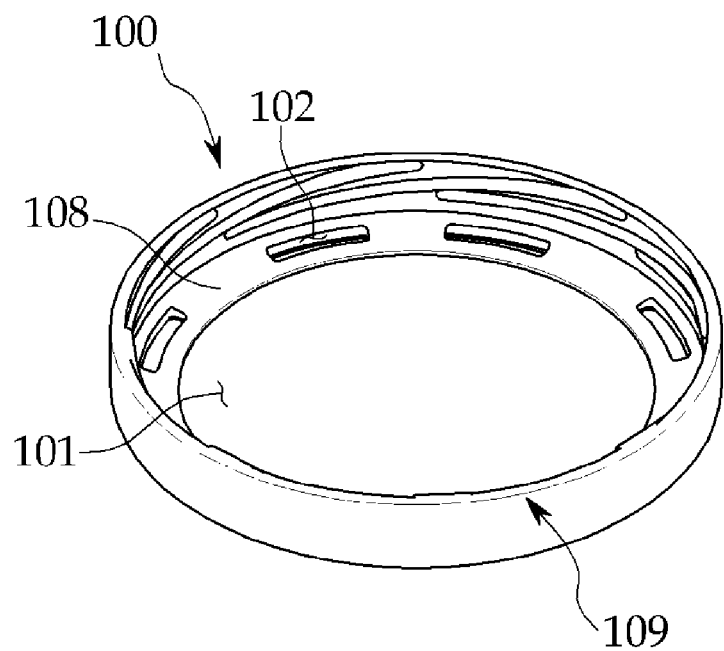
FIG. 24 is a view showing a modified embodiment of the guide member 100 of FIG. 16 having a base 108 without a first heat radiating hole 102.
Figure 25:
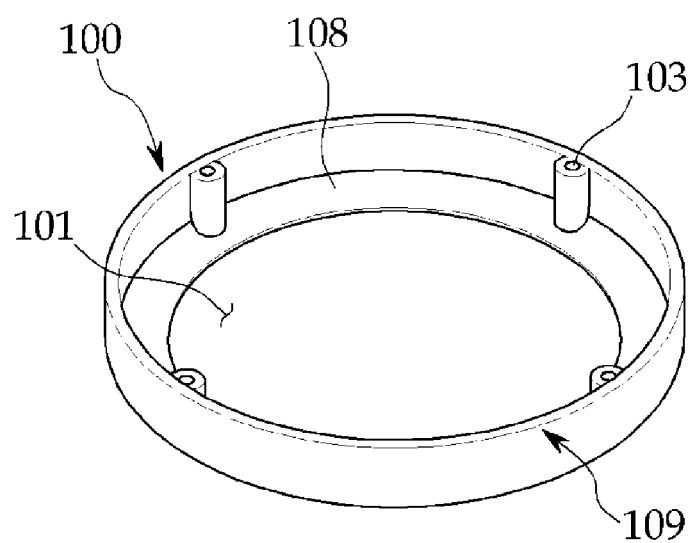
FIG. 25 is a view showing another modified embodiment of the guide member 100 of FIG. 16 having the base 108 without the first heat radiating hole 102.
Figure 26:
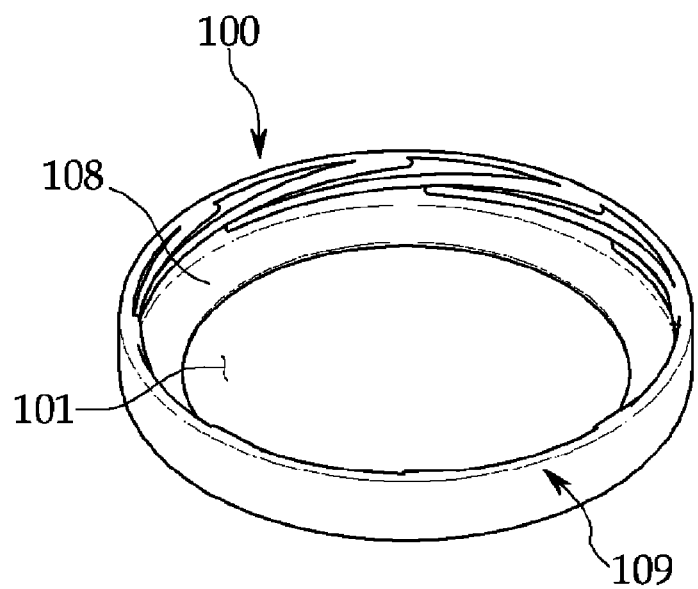
FIG. 26 is a view showing further another modified embodiment of the guide member 100 of FIG. 16 having the base 108 without the first heat radiating hole 102.

As shown in FIG. 20, when a transparent guide member 100 allows light radiated from the light source 130 to transmit the base 108 of the guide member 100, the guide member 100 does not have to include the opening 101.

Figure 39:
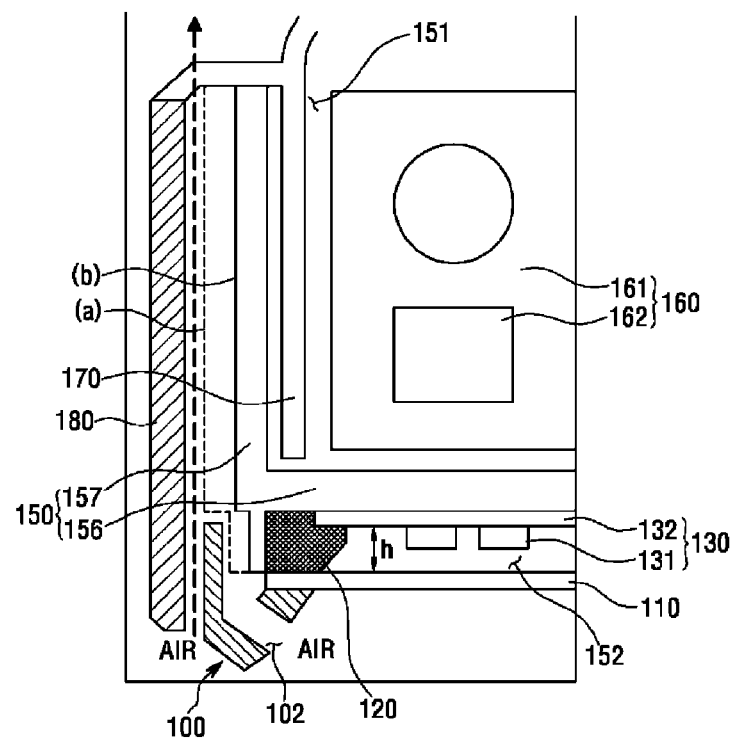
FIG. 39 is an enlarged cross sectional view showing an air flow into the inside of the lighting device of FIG. 1.

When the receiving groove 152 is formed in the heat radiating body 150, the guide member 100 presses the circumference of the light source 130 to the second receiving groove 152 of the heat radiating body 150, and, as shown in FIG. 39, fixes the light source 130 by surrounding the outside of the circumference of the lower part of the heat radiating fin 158. Otherwise, the guide member 100 fixes the light source 130 to the base 156 of the heat radiating body 150 as shown in FIG. 14.

Figure 40:
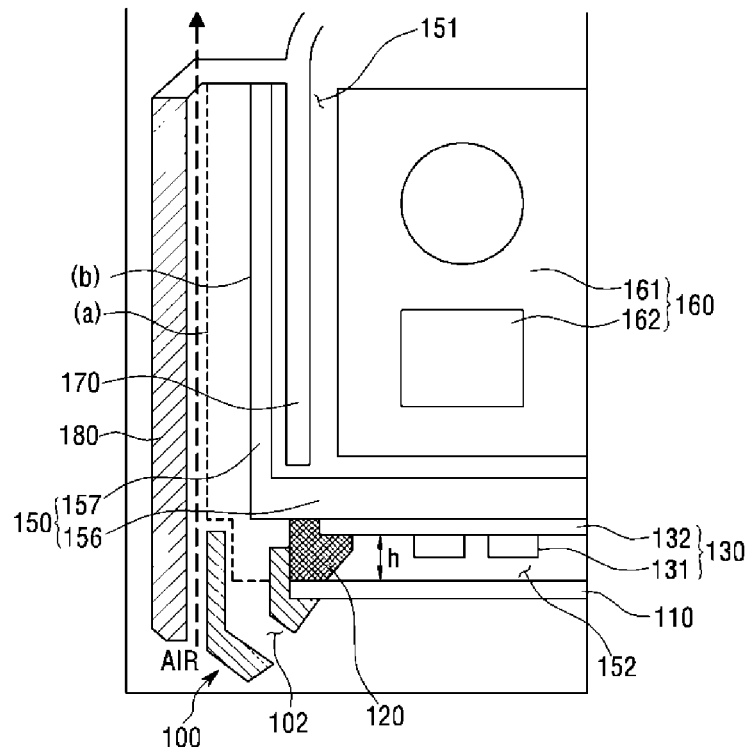
FIG. 40 is an enlarged cross sectional view showing an air flow into the inside of a lighting device of FIG. 1 in accordance with another embodiment of the present invention.
Figure 41:
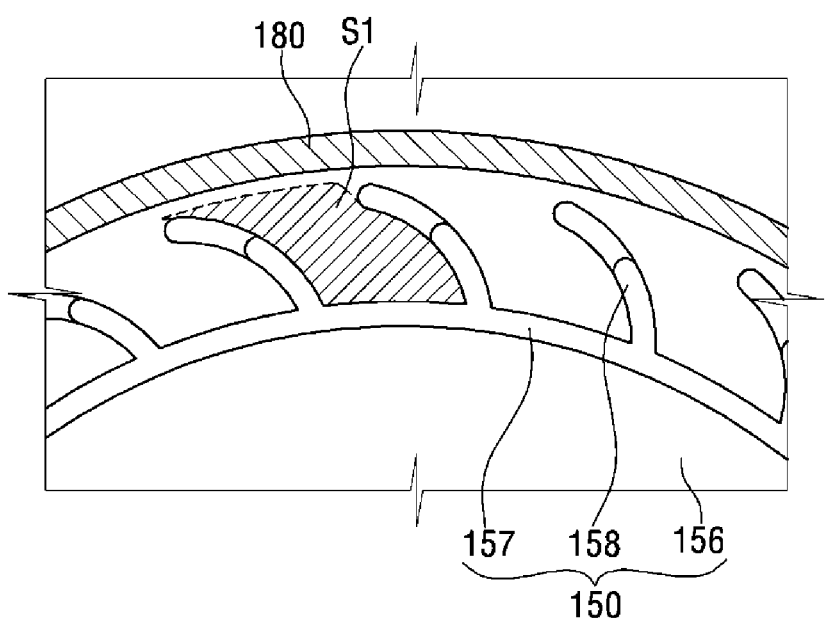
FIG. 41 is a view showing an area of an air inlet of the lighting device of FIG. 1 as viewed from the bottom thereof

When the receiving groove 152 is not formed in the heat radiating body 150, the guide member 100 fixes the light source 130 by pressing the light source 130 to the base 156 of the heat radiating body 150 and, as shown in FIG. 40, surrounding the outside of the circumference of the lower part of the heat radiating fin 158. Otherwise, the guide member 100 fixes the light source 130 to the base 156 of the heat radiating body 150 as shown in FIG. 13.

At least one of the lens 110 and the sealing ring 120 is included between the guide member 100 and the light source 130. As the guide member 100 is shown in FIGS. 20 to 23, the transparent guide member 100 has a base 108 functioning as the lens 110, so that the lens 110 is not necessary. Referring to FIG. 13, the sealing ring 120 is not necessarily included between the guide member 100 and the light source 130. In the embodiment, it is desirable to manufacture the guide member 100 with an insulating material. When the guide member 100 is made of an insulating material, without the sealing ring 120, only the guide member 100 is able to prevent the outer surface of the light source 130 from directly contacting with the heat radiating body 150. Accordingly, an electrical short-circuit, EMI, EMS and so on of the lighting device 1 are prevented and a withstand voltage characteristic is enhanced.

Since it is necessary for the guide member 100 to press the light source 130 to the second receiving groove 152 or to cause the light source 130 to contact closely with the lower part of the base 156, the width of the opening 101 is required to be less than that of the light source 130. In this case, the base 108 can give an enough pressure to the lens 110, the sealing ring 120 and the circumference of the light source 130, and able to strongly fix the lens 110, the sealing ring 120 and the light source 130 to the heat radiating body 150. Therefore, the reliability of the lighting device 1 is improved.

The guide member 100 can be coupled to the heat radiating body 150 through the locking groove 103. For example, as shown in FIGS. 4 and 14, a hole of the first fastening member 154 of the heat radiating body 150 is in a line with the locking groove 103 of the guide member 100. Then, the guide member 100 is coupled to the heat radiating body 150 by inserting a screw or a pin into the locking groove 103 and the hole of the first fastening member 154.

In FIGS. 15, 21, 23, 24 and 26, instead of the locking groove 103, a screw thread is formed on both the outer peripheral surface of the second receiving groove 152 of the heat radiating body 150 and the inner peripheral surface of the cover 109 of the guide member 100. Therefore, the guide member 100 is coupled to the heat radiating body 150 without a pin or a screw.

Lens 110

In FIGS. 4, 14 and 15, the lens 110 is disposed under the light source 130 and adjusts the distribution of light radiated from the light source 130.

The lens 110 has various shapes. For example, the lens 110 includes at least one of a parabola-shaped lens, a fresnel lens, a convex lens or a concave lens.

The lens 110 is disposed under the light source 130 and spaced apart from the light source 130 by the first distance "h". The first distance "h" is greater than 0 mm and equal to or less than 50 mm in accordance with a design of the lighting device 1.

The distance "h" is maintained by the sealing ring 120 disposed between the light source 130 and the lens 110. Otherwise, if another support for supporting the lens 110 is provided in the second receiving groove 152 of the heat radiating body 150, the distance "h" is maintained between the light source 130 and the lens 110 without using the sealing ring 120.

The lens 110 is fixed by the guide member 110. Referring to FIGS. 4 and 14 to 17, the base 108 of the guide member 100 contacts with the lens 110. The lens 110 and the light source 130 are pressed and fixed to the second receiving groove 152 of the heat radiating body 150 by the base 108 of the guide member 100. If the second receiving groove is not formed in the heat radiating body 150, the base 108 of the guide member 100 presses and fixes the lens 110 and the light source 130 to the base 156 of the heat radiating body 150.

The lens 110 is made of glass, polymethylmethacrylate (PMMA) and polycarbornate (PC) and so on. According to a design of the lighting device 1, the lens 110 includes fluorescent substance. A photo luminescent film (PLF) including the fluorescent substance is attached to a light emitting surface or a light emitting surface of the lens 110. Light radiated from the light source 130 by the fluorescent substance is emitted with a varied wavelength.

As the guide members 100 is shown in FIGS. 20 to 23, when the guide member 100 is made of a transparent material, the base 108 of the transparent guide member 100 functions as the lens 110. Here, a description of the lens 110 is applied to the base 108 of the guide member 100 in the same manner.

Inner Case 170

Figure 27:
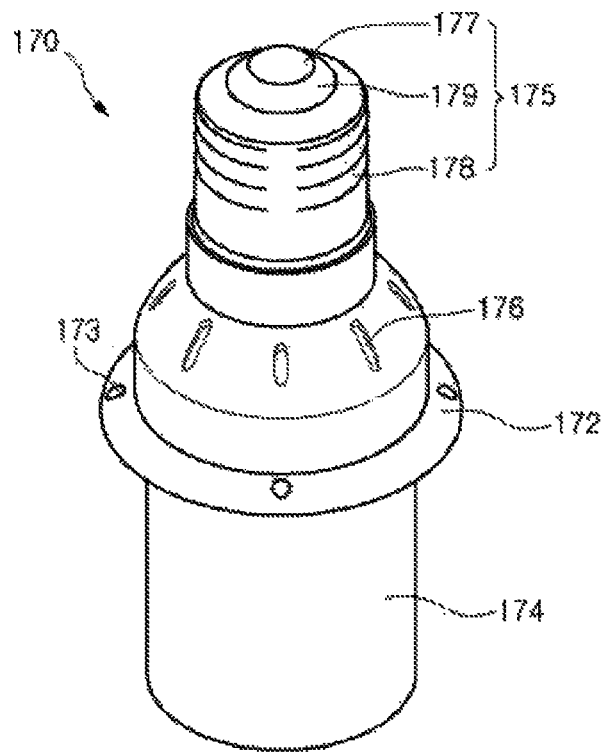
FIG. 27 is a perspective view of an inner case of the lighting device of FIG. 1.

FIG. 27 is a perspective view of an inner case of the lighting device 1 of FIG. 1.

In FIGS. 4 and 27, an inner case 170 includes a terminal 175, a cylindrical inner body 174 extending from a side of the terminal 175 and inserted into the inside of the heat radiating body 150, and a first guide 172 formed perpendicular to the outer peripheral surface of the cylindrical inner body 174 adjacent to the terminal.

The inner case 170 is made of a material with excellent insulating properties and endurance, for example, a resin material.

The inner body 174 occupies a lower part of the inner case 170. The inner body 174 is inserted into the first receiving groove 151 of the heat radiating body 150 and is disposed between the power supply controller 160 and the heat radiating body 150, thereby preventing the power supply controller 160 from contacting with the heat radiating body 150. As a result, an electrical short-circuit, EMI, EMS and so on are prevented and a withstand voltage characteristic of the lighting device 1 is enhanced.

The terminal 175 occupies an upper part of the inner case 170. The terminal 175 is connected to an external power supply in the form of a socket. That is, the terminal 175 includes a first electrode 177 at the top thereof, a second electrode 178 on the lateral surface thereof and an insulating member 179 between the first electrode 177 and the second electrode 178. The first and second electrodes 177 and 178 are provided with electric power by an external power supply. Here, the shape of the terminal 175 is variously changed based on a design of the lighting device 1.

The first guide member 172 is formed on the interface between the inner body 174 and the terminal 175, so that the first guide member 172 has a longer diameter than that of the first receiving groove 151. As a result, the first receiving groove 151 is able to receive only the inner body 174 of the inner case 170.

The first guide member 172 includes at least one first coupling hole 173. The inner case 170 is coupled to an outer case 180 by inserting a screw or a pin into at least one first coupling hole 173.

Moreover, a plurality of second heat radiating holes 176 are formed in the inner case 170, improving the heat radiation efficiency of the inside of the inner case 170.

Power Supply Controller 160

In FIGS. 3, 4 and 7, the power supply controller 160 is disposed in the first receiving groove 151 of the heat radiating body 150 and is electrically connected to the light source 130 by the second wiring 165 penetrating the through hole 153 formed in the base 156 of the heat radiating body 150. The power supply controller 160 is operated by electric power being fed.

The power supply controller 160 includes a supporting substrate 161 and a plurality of parts 162 mounted on the supporting substrate 161. A plurality of the parts 162 include, for example, a DC-DC converter converting an alternating current supplied from an external power supply into an direct current, a driving chip controlling to drive the light source 130, an electrostatic discharge (ESD) protective device protecting the light source 130.

The power supply controller 160 is electrically connected to the light source 130 and the terminal 175 of the inner case 170 by the second wiring 165 and a first wiring 164 respectively. Specifically, the first wiring 164 is connected to the first electrode 177 and the second electrode 178 of the terminal 175 and is supplied with electric power by an external power supply. Besides, a power connection terminal (not shown), which is connected directly to the first and the second electrodes 177 and 178, can be formed on the supporting substrate 161 without the first wiring 164. The second wiring 165 passes through the through hole 153 of the heat radiating body 150 and connects electrically the power supply controller 160 to the light source 130. Moreover, the light source 130 is formed in the form of an integral module consisting of the light emitting device 131, the substrate 132 and the power supply controller 160. In this case, the power supply controller 160 is formed in the lower part of the heat radiating body 150. Here, it is enough as long as the first wiring 164 or the power connection terminal which functions as the first wiring 164 on the supporting substrate 161 is provided without the second wiring 165.

Even though the supporting substrate 161 is disposed horizontally within the inner body 174 of the inner case 170, it is possible to start and operate the light source 130 of the power supply controller 160. However, in FIGS. 27 to 29, it is desirable to dispose the supporting substrate 161 vertically in order that the air flows smoothly in the inner case 170. When the supporting substrate 161 is disposed vertically, the air flows in up and down direction in the inner case 170 due to convection current, thereby improving the heat radiation efficiency of the lighting device 1 and particularly helping the heat radiation efficiency of the power supply controller 160 to be enhanced, as compared with a case where the supporting substrate 161 is disposed horizontally.

However, although the supporting substrate 161 is not necessarily disposed in the vertical direction in the inner case 170, as long as the air is able to flow in the inner body 174 in the up and down direction of the heat radiating body 150, it is possible to obtain the same effect as that of a case where the supporting substrate 161 is disposed in the vertical direction. Therefore, it does not matter that the supporting substrate 161 is sloping slightly with respect to the vertical direction.

As long as the supporting substrate 161 does not prevent the air from flowing upward in the inner body 174, it is also possible to increase the heat radiation efficiency of the power supply controller 160. For example, even though the supporting substrate 161 is disposed in a horizontal direction to the base 156 of the heat radiating body 150, the supporting substrate 161 having a through hole formed therein causes the air to pass through supporting substrate 161 and flow upward and downward in the inner body 174. Otherwise, when the supporting substrate 161 disposed horizontally has a different shape from the horizontal section shape of the inner body 174 or when the supporting substrate 161 having the same shape as the horizontal section shape of the inner body 174 has a less diameter than the inner diameter of the inner body 174, the air is able to flow upward and downward in the inner body 174. Eventually, the inside of the inner body 174 is not shielded upward and downward, the air is able to flow in the inner body 174, thereby improving the heat radiation efficiency of the lighting device 1 and particularly helping the heat radiation efficiency of the power supply controller 160.

When the supporting substrate 161 is disposed vertically or is sloping slightly from the vertical direction in the inner case 170, the weight of the power supply controller 160 during a long-term use of the lighting device 1 causes the power supply controller 160 to move downward, so that the second wiring 165 is pressed and damaged by the supporting substrate 161. When the diameter of the through hole 153 formed on the lower part of the heat radiating body 150 is small, the second wiring 165 is pressed by the supporting substrate 161 and is damaged by being put between the supporting substrate 161 and the base 156 of the heat radiating body 150 during the process of assembling the lighting device 1.

Figure 28:
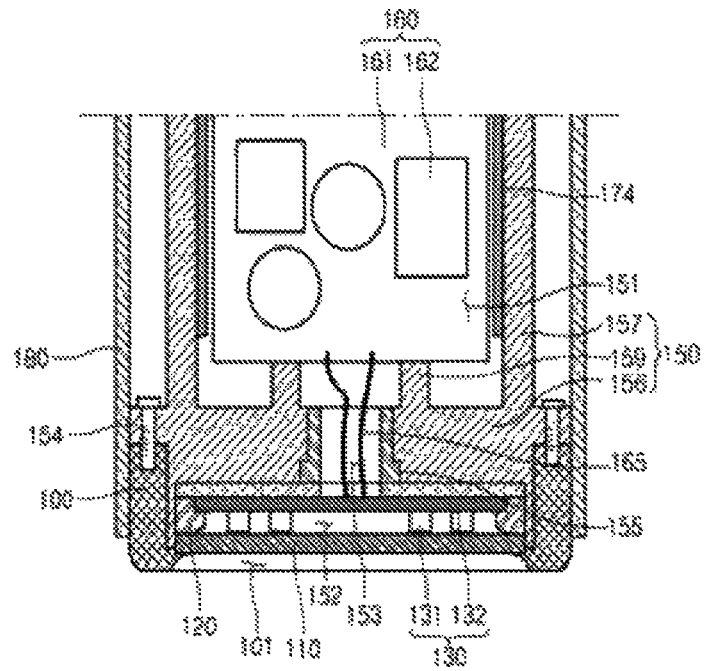
FIG. 28 is a longitudinal cross sectional view of a lower part of a lighting device having a supporter 159 formed on a base 156 of a heat radiating body 150 in accordance with an embodiment of the present invention.
Figure 30:
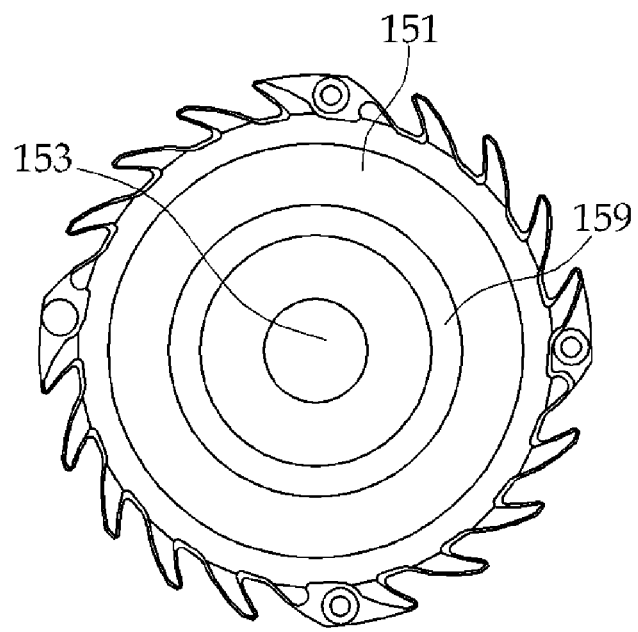
FIG. 30 is a plan view of a heat radiating body 150 used in the lighting device shown in FIG. 28.
Figure 31:
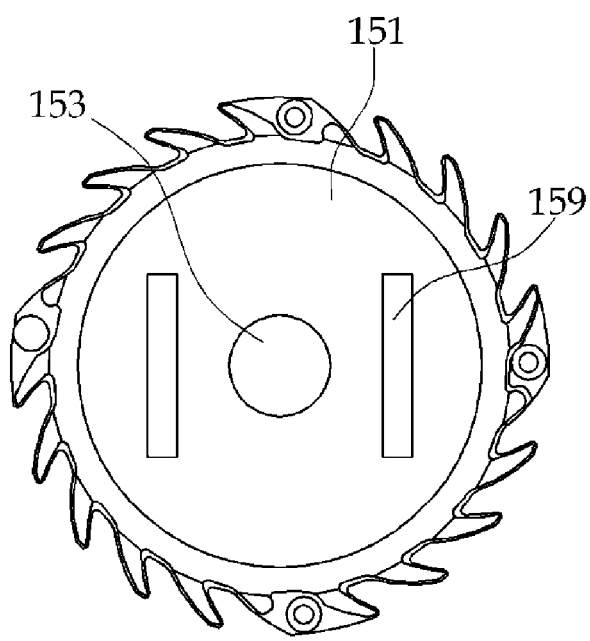
FIG. 31 is a plan view of a modified embodiment of a heat radiating body 150 used in the lighting device shown in FIG. 28.

In the embodiment shown in FIG. 28, a supporter 159 is formed around the through hole 153 in the base 156 of the heat radiating body 150, the supporter 159 supports the supporting substrate 161 and prevents the second wiring 165 from being damaged. In FIG. 30, the supporter 159 surrounds the through hole 153 and is formed on the base in the form of a protruding cylindrical shape. In FIG. 31, the supporter 159 is formed in the form of a bar lying on the base 156. Moreover, the supporter 159 can have any shape capable of spacing the supporting substrate 161 and the base 156 of the heat radiating body 150. In the embodiment of FIG. 30, it is possible to reduce the heat transferred from the light source 130 to the power supply controller 160 by causing the diameter of the through hole 153 to be as small as that of the embodiment of FIG. 4. It is also possible to prevent the second wiring 165 from being pressed and damaged by the supporting substrate 161 by causing the supporter 159 to have a larger diameter than that of the through hole 153. In the embodiment shown in FIG. 31, the supporter 159 is disposed apart from the through hole 153 by a predetermined distance, which produces the same effect as that of the embodiment of FIG. 30.

Like the embodiments of FIGS. 28, 30 and 31, as compared with the case where the supporter 159 is disposed on the base 156 and spaced apart from the through hole 153 by the same distance as the diameter of the through hole 153, when the supporter 159 is disposed on the base 156 and spaced apart from the through hole 153 by a greater distance than the diameter of the through hole 153, it is possible to obtain an additional effect to improve work efficiency in a work for removing the lighting device 1 breakdown especially due to a defective connection of the light source 130 and the second wiring 165.

Figure 29:
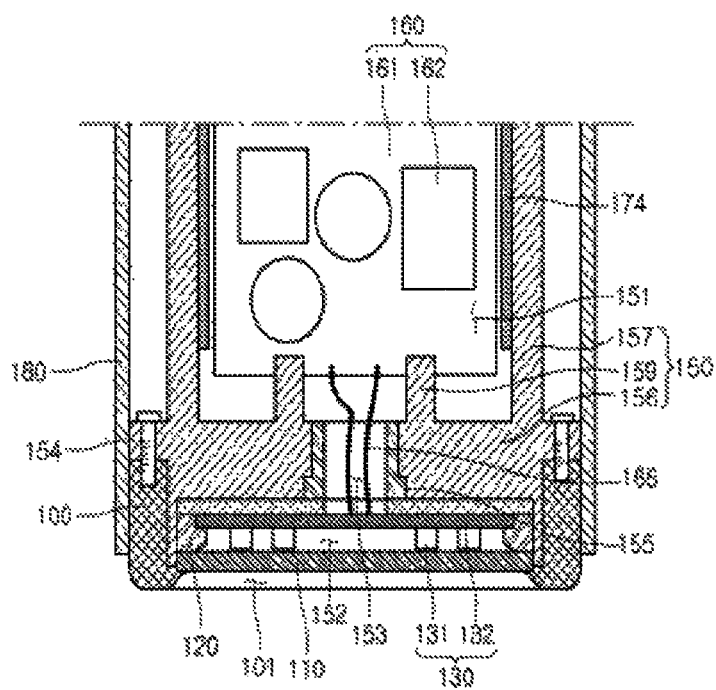
FIG. 29 is a longitudinal cross sectional view of a lower part of a lighting device having a supporter 159, which includes a groove for coupling a power supply controller 160, formed on a base 156 of a heat radiating body 150 in accordance with an embodiment of the present invention.
Figure 32:
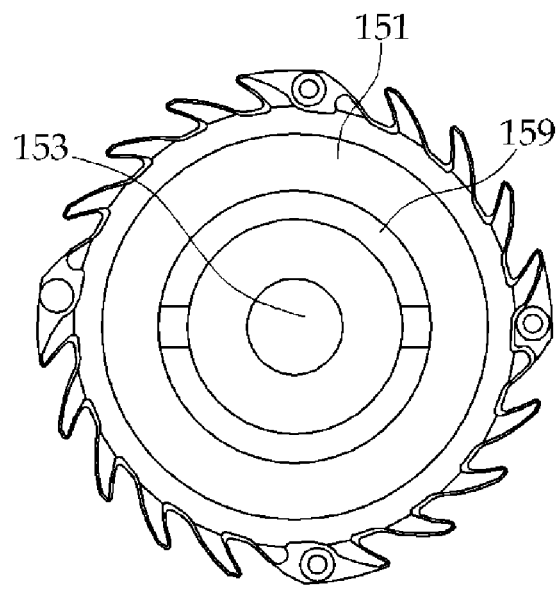
FIG. 32 is a plan view of a heat radiating body 150 used in the lighting device shown in FIG. 29.
Figure 33:
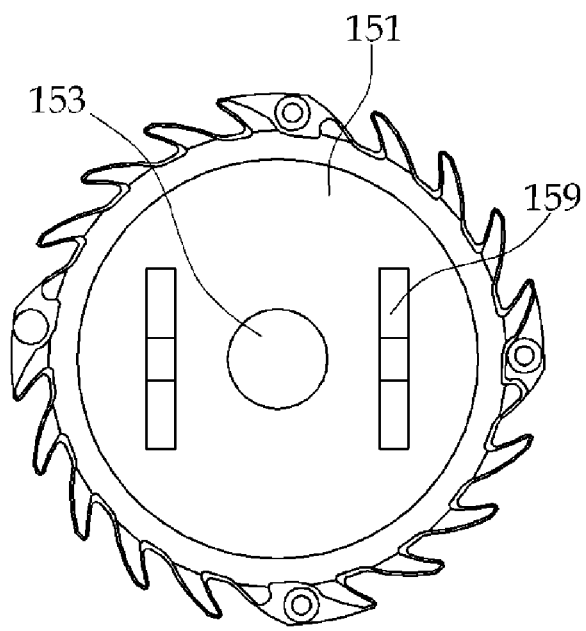
FIG. 33 is a plan view of a modified embodiment of a heat radiating body 150 used in the lighting device shown in FIG. 29.

Meanwhile, like the embodiments shown in FIGS. 29, 32 and 33, when a groove for coupling the power supply controller 160 is formed in the supporter 159, the supporting substrate 161 is inserted into the groove, preventing the power supply controller 160 from moving within the receiving groove 151 and fixing the supporting substrate 161. For the purpose of more strongly coupling the supporting substrate 161 and the groove for coupling the power supply controller 160, for protecting the power supply controller 160 from an external impact and for reducing the heat transferred directly from the heat radiating body 150, a sealing member made of a rubber material or a resin material can be placed between the supporting substrate 161 and the groove for coupling the power supply controller 160.

Outer Case 180

FIGS. 34 to 38 are perspective views of an outer case 180 as viewed from the top. As shown in FIG. 4, the outer case 180 is coupled to the inner case 170, receives the heat radiating body 150, the light source 130 and the power supply controller 160, etc., and forms an external shape of the lighting device 1. The outer case 180 is made of a material having an excellent insulation and endurance such as a resin material. In FIGS. 3, 34 to 38, while the outer case 180 has a circular section, the outer case 180 can have a polygon section or elliptical section and so on. Since the outer case 180 surrounds the heat radiating body 150, it is possible to prevent a burn accident due to the heat generated from the operation of the lighting device 1 and an electric shock during a repair or exchange of the lighting device 1.

Figure 34:
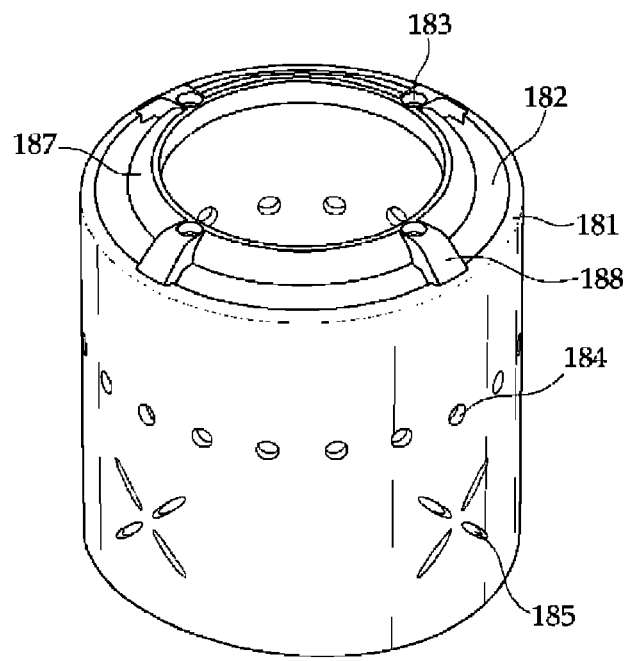
FIG. 34 is a perspective view of an outer case 180 of the lighting device of FIG. 1.

In FIGS. 4, 27 and 34, the outer case 180 includes an outer wall 181 which is spaced apart from the heat radiating body 150 by a predetermined interval and surrounds the heat radiating body 150, a ring-shaped second guide 187 contacting directly with the first guide 172, and at least one projection 188 connecting the outer wall 181 with the second guide 187.

Here, the outer case 180 is spaced apart from the heat radiating body 150 by a predetermined interval and surrounds the heat radiating body 150. Like the embodiment shown in FIGS. 13 to 15, when the heat radiating fin 158 is formed on the outer peripheral surface of the body 157 of the heat radiating body 150, the outer case 180 is spaced apart from a prominence (a) denoted by a dotted-line among the prominence (a) and depression (b) of the heat radiating body 150 and surrounds the heat radiating body 150. The outer case 180 includes at least one ventilating hole 182, i.e., a space between the outer wall 181 and the second guide 187 such that the air is able to flow to the inside and outside of the lighting device 1, thereby allowing the air to flow smoothly in the lighting device 1 and improving the heat radiation efficiency of the lighting device 1.

As shown in FIG. 34, at least one ventilation hole 182 is formed in the edge of the upper surface of the outer case 180. The outermost edge portion and innermost edge portion have circular arc shapes, including a circular shape, an elliptical shape and a polygon shape and the like. The ventilation hole 182 can be formed on the outer wall 181 (not shown).

Figure 35:
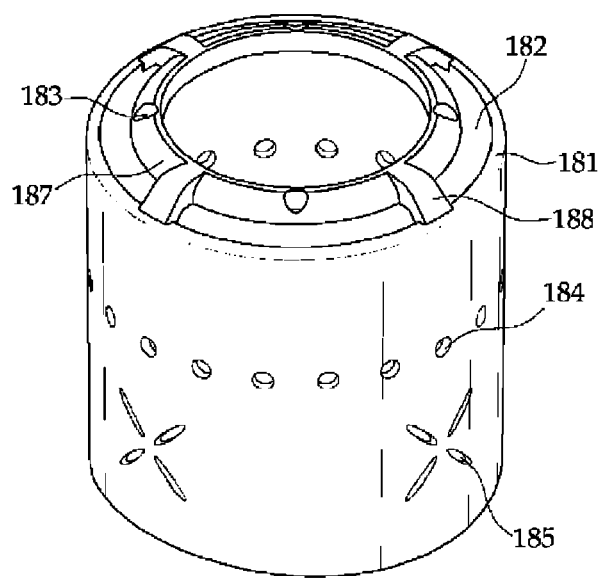
FIG. 35 is a perspective view of a modified embodiment of an outer case 180 of the lighting device of FIG. 1.

In FIGS. 34 and 35, a second coupling groove 183 for coupling the outer case 180 and inner case 170 is formed on the second guide 187 or on at least one projection 188.

Figure 37:
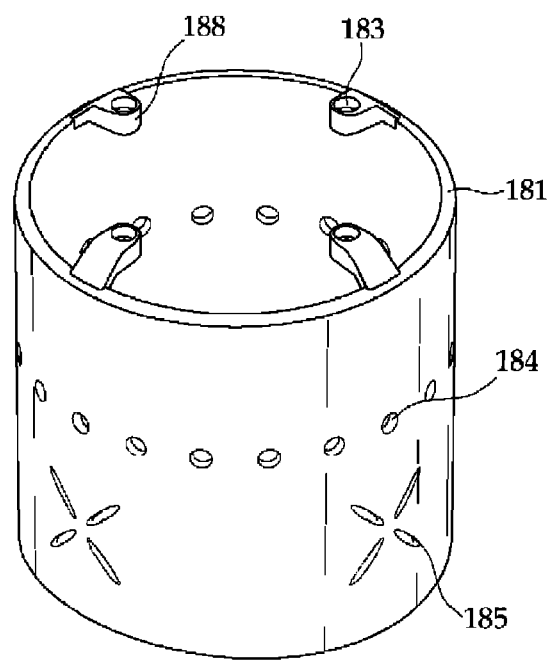
FIG. 37 is a perspective view of further another modified embodiment of an outer case 180 of the lighting device of FIG. 1.

In FIG. 37, the second guide 187 is not provided to the outer case 180. The outer case 180 includes at least one projection 188 includes both the outer wall 181 surrounding the heat radiating body 150 and at least one projection 188 connecting the outer wall 181 with the first guide 172. The projection 188 includes the second coupling groove 183 for coupling the first guide 172 shown in FIG. 27 to the outer case 180.

Here, the outer case 180 is spaced apart from the heat radiating body 150 by a predetermined distance and surrounds the heat radiating body 150. Like the embodiment shown in FIGS. 13 to 15, when the heat radiating fin 158 is formed on the outer peripheral surface of the body 157 of the heat radiating body 150, the outer case 180 is spaced apart from a prominence (a) denoted by a dotted-line among the prominence (a) and depression (b) of the heat radiating body 150 and surrounds the heat radiating body 150.

In the embodiments in FIGS. 2, 27 and 34, the inner case 170 is covered with the outer case 180 in the direction from the terminal 175 to the lower part of the inner case 170. As a result, the second guide 187 is placed between the first guide 172 and at least one projection 188. Accordingly, the outer case 180 and the inner case 170 are coupled to each other by inserting a screw or a pin into the second coupling groove 183.

Otherwise, the inner body 174 of the inner case 170 passes through an opening of the outer case 180 in the direction from the top of the outer case 180 to the lower part of the outer case 180 and contacts with the outer case 180. Subsequently, the first coupling groove 173 comes in a line with the second coupling groove 183. Thus, the outer case 180 and the inner case 170 are coupled to each other by inserting a screw or a pin into the first coupling groove 173.

In FIGS. 27 and 37, unlike the cases mentioned above, since the outer case 180 does not include, at least one projection 188 contacts directly with and is coupled to the first guide 172. As a result, the outer case 180 and the inner case 170 are coupled to each other.

In FIGS. 2, 4, 6 and 7, a screw hole or a pin hole is formed on the upper surface of the body 157 of the heat radiating body 150. The first coupling groove 173, the second coupling groove 183 and the screw hole or the pin hole come in a line with each other. Thus, the outer case 180, the inner case 170 and the heat radiating body 150 are coupled to each other by inserting a screw or a pin into the hole and the grooves.

Unlike the case shown in FIG. 4, it is not necessary to couple the outer case 180, the inner case 170 and the heat radiating body 150 at a time. For example, after the inner case 170 and the heat radiating body 150 are first coupled to each other by using a screw or a pin, the inner case 170 and the outer case 180 can be coupled to each other by using another screw or pin. Otherwise, after the outer case 180 and the heat radiating body 150 are first coupled to each other by using a screw or a pin, the outer case 180 and the inner case 170 can be coupled to each other by using another screw or pin.

It is not necessary that a screw or a pin inserted into the first coupling groove 173, the second coupling groove 183 and the screw hole or the pin hole formed on the upper surface of the body 157 of the heat radiating body 150 is a separate member. It is acceptable to use a pin formed integrally with the upper surface of the body 157 of the heat radiating body 157, a pin formed integrally with the first guide 172, and a pin formed integrally with the second guide 187. In this case, the heat radiating body 157, the inner case 170 and the outer case 180 are coupled to each other by using an interference fit.

Besides, an upward screw is integrally formed with the upper surface of the body 157 of the heat radiating body 150, and the first coupling groove 173 and the second coupling groove 183 come in a line with the screw. After the inner case 170 and the outer case 180 are pushed and in close contact with each other in the direction of the upper surface of the heat radiating body 150, the upward screw is inserted into the grooves. As a result, the heat radiating body 150, the inner case 170 and the outer case 180 are coupled to each other.

If the lighting device 1, particularly, an LED lighting device includes the outer case 180, its heat radiation efficiency may generally decrease. However, like the embodiments shown in FIGS. 13 to 15, when the heat radiating body 150, the inner case 170 and the outer case 180 are coupled to each other, the heat radiation efficiency is sufficiently increased through a chimney effect and a contact area between the heat radiating body 150 and the outer case 180 is minimized. As a result, it is possible to minimize the heat transferred from the heat radiating body 150 to outer case 180. A principle of obtaining an excellent heat radiating effect through a chimney effect will be described below in detail in another part of this application.

Eventually, even though the lighting device 1 is running, since it is possible to cause the temperature of the outer case 180 often touched by hand at the time of repairing or exchanging the lighting device 1 to be lower than a temperature in which a person feels hot, the lighting device 1 is easy to handle. On the contrary, with regard to an existing lighting device, its heat radiation efficiency should be reduced in order to easily handle the existing lighting device. Otherwise, the existing lighting device is hard to handle in order to obtain the high heat radiation efficiency. Accordingly, in the embodiments shown in FIG. 13 to15, there is a difference between the existing lighting devices and the lighting device 1 of the present invention in that the lighting device 1 obtains the high heat radiation efficiency and is easy to handle.

In FIGS. 34, 35 and 37, the lateral surface of the outer case 180 may include at least a marking groove 185 and a hole 184. The marking groove 185 is used for easily handling the lighting device 1. The hole 184 is used for increasing the heat radiation efficiency. The hole 184 and the marking groove 185 may have various shapes including the shapes shown in the embodiment.

Figure 36:
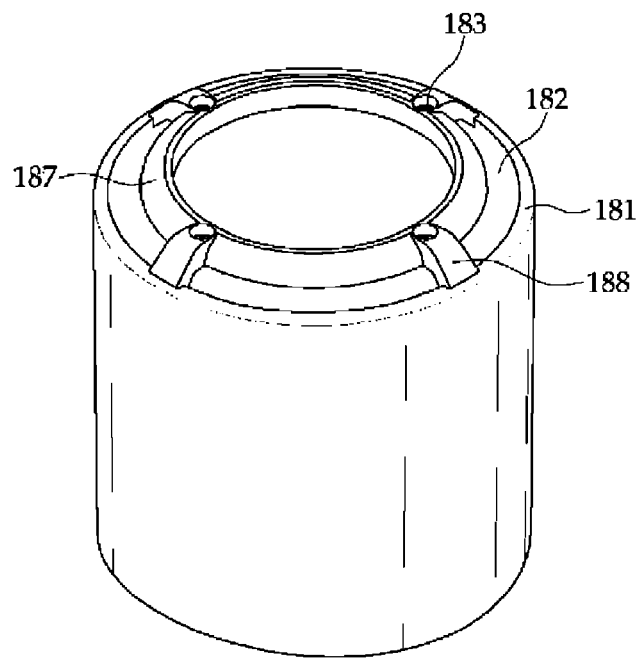
FIG. 36 is a perspective view of another modified embodiment of an outer case 180 of the lighting device of FIG. 1.
Figure 38:
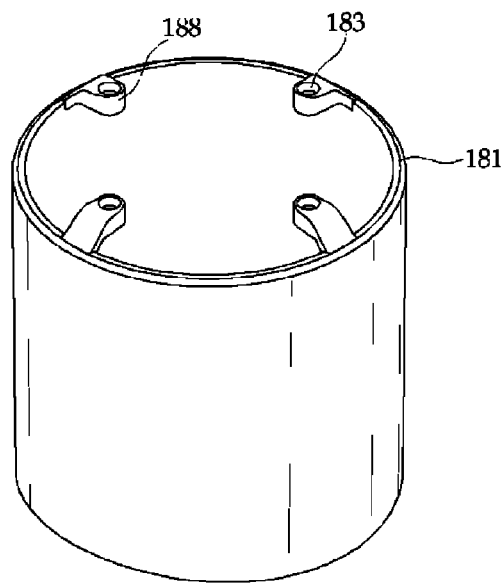
FIG. 38 is a perspective view of yet another modified embodiment of an outer case 180 of the lighting device of FIG. 1.

However, as shown in FIGS. 36 and 38, it is not necessary to form the marking groove 185 and at least one hole 184 on the lateral surface of the outer case 180.

Description of Excellent Heat Radiation Efficiency

The heat radiation efficiency shown in the foregoing embodiments is much more excellent than that of an existing LED lighting device. This results from a chimney effect. The chimney effect means that smoke or air flows in the vertical space of a building due to a density difference, i.e., buoyancy caused by a temperature difference between the inside of a building and external air. The chimney effect is generally used in the field of building construction.

Figure 42:
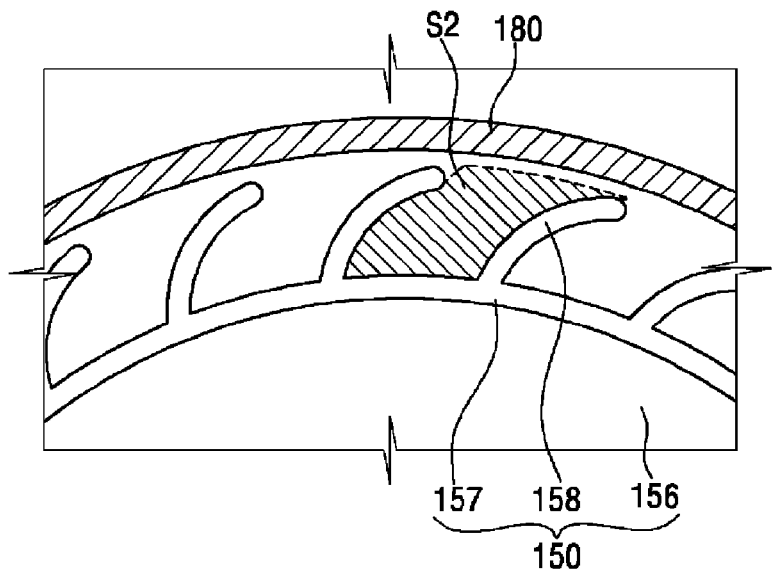
FIG. 42 is a top view showing an area of an air inlet of the lighting device of FIG. 1 as viewed from the top thereof

The principle of the lighting device 1 of the present invention will be described with reference to FIGS. 3, 13 to 15 and 39 to 42. When a LED lighting device is started and operated, heat from the light source 130 is directly transferred to the heat radiating body 150 or transferred to the heat radiating body 150 through the heat radiating plate 140 interposed between the heat radiating body 150 and the light source 130. Then, the heat is transferred from the heat radiating body 150 to the air in a space formed between the heat radiating body 150 and the outer case 180, so that the air is heated. Since the heated air has a lower density than that of the external air, the air rises upward due to buoyancy. The rising air, which is denoted by S2 in FIG. 42, is divided by the upper part of the outer case 180 and the outer lateral surface of the upper part of the body 157 of the heat radiating body 150, and then the air passes through an open space connected fluidly to the external air and goes out.

In the embodiment, if the heat radiating hole 102 is formed in the guide member 100, the heat radiating hole 102 performs a function of a passage allowing the external air to flow to the inside of the lighting device. Even if the heat radiating hole 102 is not formed in the guide member 100, like the embodiment shown in FIGS. 13 to 15, a passage is formed, which allows the air to flow in between the upper part of the outer case 180 and the lower part of the outer peripheral surface of the body 157. That is, although the air heated inside the lighting device 1 rises and goes outside the lighting device 1, new air flowing from the outside into the inside of the lighting device 1 takes the place of the risen air, so that new air capable of radiating the heat from the heat radiating body 150 continuously flows to the inside of the lighting device 1. As such, since new external air flows continuously to the inside and outside of the lighting device 1 and cools the heat radiating body 150, the heat radiation efficiency is notably improved compared to that of the existing LED lighting device.

Referring to FIGS. 39 and 40, the heat radiating fin 158 is spaced apart from the outer case 180, and thereby even reducing heat transferred from the heat radiating body 150 to the outer case 180.

Figure 43:
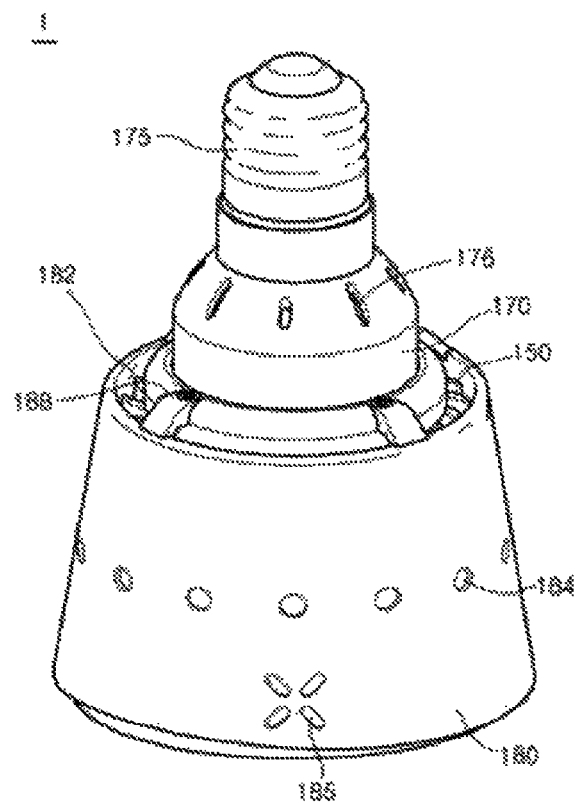
FIG. 43 is a perspective view of a lighting device to which chimney effect is applied.
Figure 44:
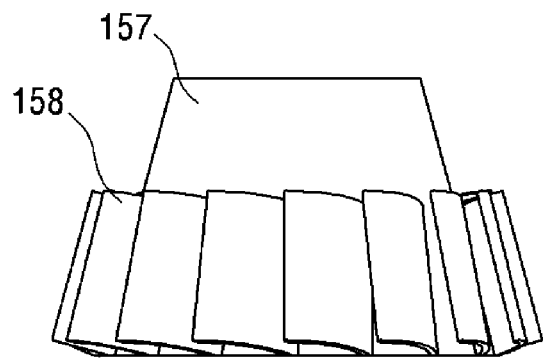
FIG. 44 is a front view of a heat radiating body 150 used in the lighting device in accordance with the embodiment of FIG. 43.
Figure 45:
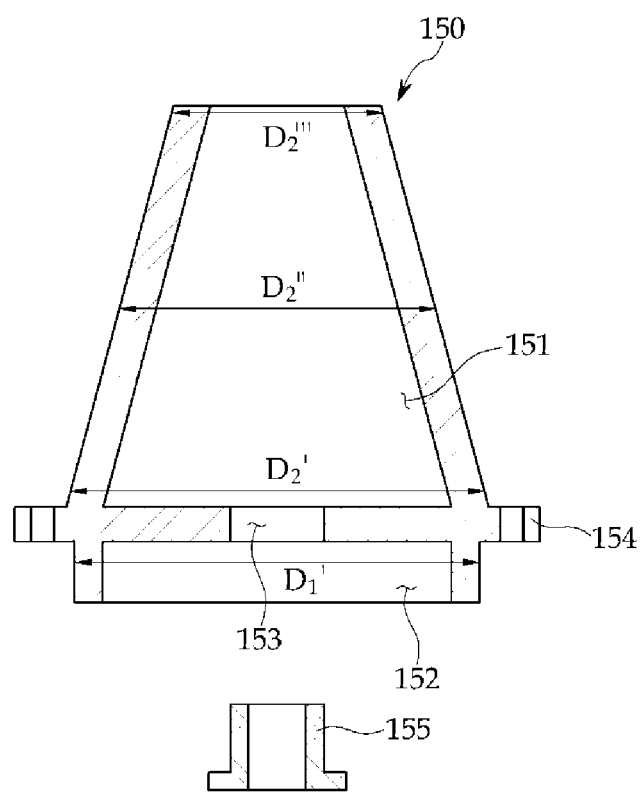
FIG. 45 is a longitudinal cross sectional view of the heat radiating body 150 of FIG. 44.

FIGS. 43 to 45 show that the width of the outer case 180 of the lighting device 1 is more decreased toward a further upper part of the outer case 180. In FIG. 45, the section of the heat radiating body 150 has a trapezoidal shape in such a manner as to be parallel with the outer case 180. In FIG. 44, the end of lateral surface of the heat radiating fin 158 is parallel with the outer case 180. In the embodiment, the air passes through the parts of S1 and S2 in order of S1 to S2, so that the air flows more smoothly. Accordingly, the heat radiation efficiency is more improved.

Figure 46:
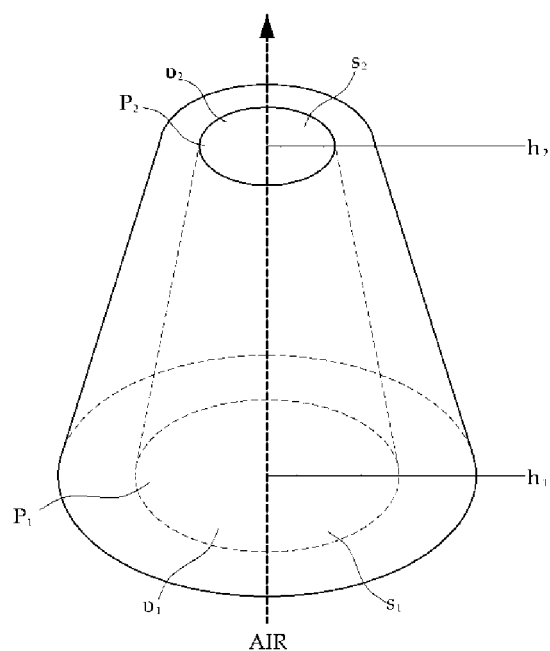
FIG. 46 is a view used for describing Bernoulli's theorem and a continuity equation of an incompressible flow.

Referring to FIG. 46, improvement of the heat radiation efficiency will be described based on Bernoulli's theorem and incompressible flow continuity equation.

Bernoulli's theorem is described in the following equation (1).

$$P_1 + \tfrac{1}{2}\rho v_1^2 + \rho g h_1 = P_2 + \tfrac{1}{2}\rho v_2^2 + \rho g h_2 \quad (1)$$

In equation (1), P represents a pressure; $\rho$ represents a density; $v$ represents a speed; g represents an acceleration of gravity; and h represents a height. Based on FIG. 46, a subscript 1 represents a bottom; and a subscript 2 represents a top.

Incompressible flow continuity equation is described in the following equation (2).

$$A_1 v_1 = A_2 v_2$$

$$A_1 v_1 = A_2 v_2 \quad (2)$$

In equation (2), A represents a cross section area; and $v$ represents a speed. Based on FIG. 46, a subscript 1 represents a bottom; and a subscript 2 represents a top.

In equation (2), since the cross section area S1 of the lower part through which a fluid passes is greater than the cross section area S2 of the upper part (S1>S2), the speed of the fluid of the upper part is greater than that of the lower part (V2>V1).

The equation (1) can be rearranged by the following equation (3).

$$P_1 - P_2 = \tfrac{1}{2}\rho(v_2^2 - v_1^2) + \rho g(h_2 - h_1) \quad (3)$$

Since the height of the upper part from the ground is greater than that of the lower part, the right side of the equation (3) is positive. Eventually, the pressure of the lower part is greater than that of the upper part (P1>P2). This means that the greater the height difference between the lower and upper parts is and the greater the cross section area difference between the lower and upper parts is, the greater the pressure difference between the lower and upper parts is. As a result, the fluid flows more smoothly.

In other words, referring to 41 and 42, assuming that a cross sectional area generated by cutting a space determined by both the outer case 180 and the lower part of the heat radiating body 150 in the direction perpendicular to the longitudinal direction of the heat radiating body 150 is denoted by S1 and a cross sectional area generated by cutting a space determined by the outer case 180 and the upper part of the heat radiating body 150 in the direction perpendicular to the longitudinal direction of the heat radiating body 150 is denoted by S2, a pressure of an air inlet port having a cross sectional area of S1 is greater than that a pressure of an air outlet port having a cross sectional area of S2. Therefore, when air flows due to the chimney effect, the air is forced to flow more smoothly.

Figure 47:
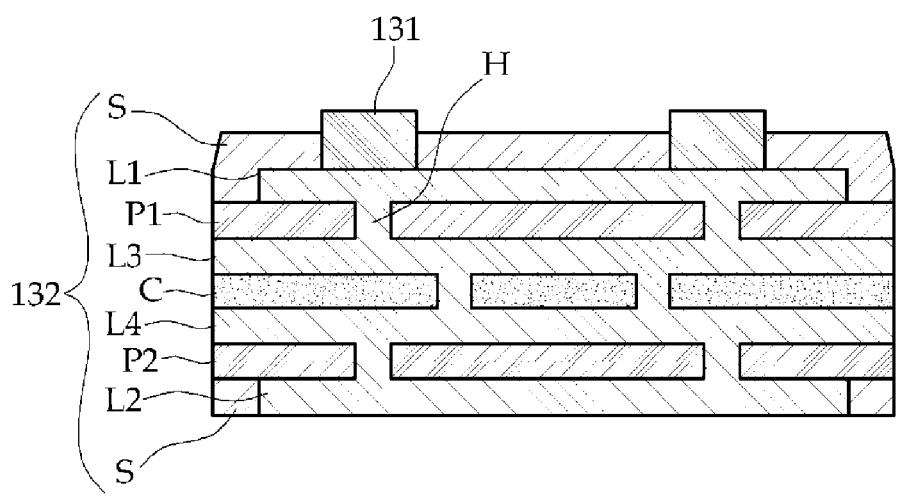
FIG. 47 is a cross sectional view of a substrate of the heat radiating body.

FIG. 47 is a cross sectional view of a substrate of the heat radiating body.

Referring to 47, a plurality of the light emitting devices 131 are arranged on the substrate 132 and are received in the second receiving groove 152 of the heat radiating body 150. The substrate 132 includes a first conductive layer L1, a first insulation layer P1, a FR4 copper-clad laminate sheet C, a second insulation layer P2 and a second conductive layer L2. The substrate 132 may further include a third conductive layer L3 and a fourth conductive layer L4. The third conductive layer L3 is formed between the first insulation layer P1 and the FR4 copper-clad laminate sheet C. The fourth conductive layer L4 is formed between the FR4 copper-clad laminate sheet C and the second insulation layer P2. That is, the third conductive layer L3 and the fourth conductive layer L4 may be omitted.

The plurality of the light emitting devices 131 are arranged on the first conductive layer L1 in the form of a circle. The first insulation layer P1 is disposed under the first conductive layer L1.

A distance from the central axis of the substrate 132 to the outermost end of the first conductive layer L1 is less than a distance from central axis of the substrate 132 to the outermost end of the first insulation layer P1 by a predetermined distance "D". Here, the central axis penetrates the center of the circular substrate 132. The substrate 132 may have a polygonal shape such as a triangle or a quadrangle and the like as well as a circle shown in FIG. 9. Therefore, in this specification, there is no requirement that the central axis penetrates the center of the circular substrate 132.

As such, when a distance from the central axis of the substrate 132 to the outermost end of the first conductive layer L1 is less than a distance from the central axis of the substrate 132 to the outermost end of the first insulation layer P1, the first conductive layer L1 becomes further from the inner peripheral surface formed by the second receiving groove 152 of the heat radiating body 150, so that it is possible to prevent electric shock between the heat radiating body 150 and the substrate 132. As a result, a withstand voltage of the lighting device 1 can be improved.

It is desirable that the first conductive layer L1 is made of a material having high thermal conductivity and high electrical conductivity, for example, copper, etc.

The first insulation layer P1 is disposed between the first conductive layer L1 and the third conductive layer L3. A via H is formed in the first insulation layer P1 so as to electrically connect the first conductive layer L1 with the third conductive layer L3. It is desirable that the via H is made of a material having high thermal conductivity and high electrical conductivity, for example, copper.

The first insulation layer P1 is required to be formed of prepreg.

The FR4 copper-clad laminate sheet C is disposed between the third conductive layer L3 and the fourth conductive layer L4. A via H is formed in the FR4 copper-clad laminate sheet C so as to electrically connect the third conductive layer L3 with the fourth conductive layer L4.

The second insulation layer P2 is disposed between the fourth conductive layer L4 and the second conductive layer L2. A via H is formed in the second insulation layer P2 so as to electrically connect the fourth conductive layer L4 with the second conductive layer L2. It is desirable that the via H is made of a conductor like copper. Just like the first insulation layer P1, the second insulation layer P2 is required to be formed of prepreg.

The second conductive layer L2 is disposed under the second insulation layer P2.

Figure 9:
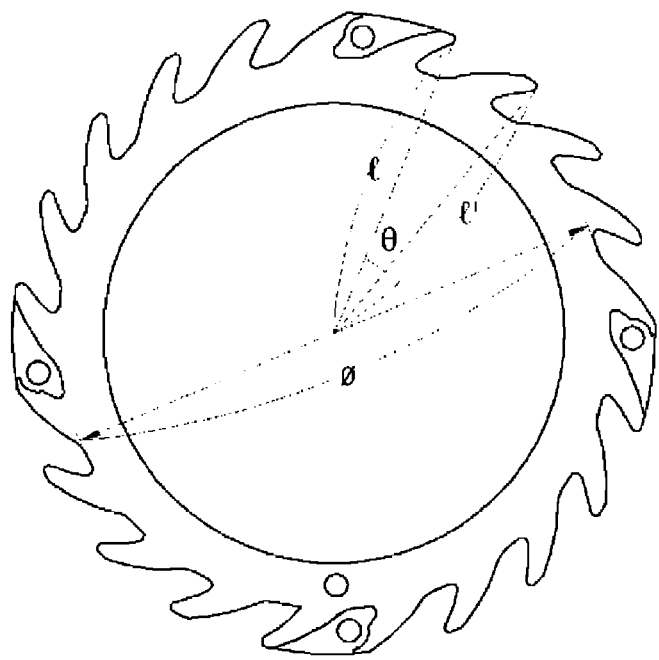
FIG. 9 is a plan view of a heat radiating body used in a lighting device consuming an electric power of 5 W or 8 W.

A distance from the central axis of the substrate 132 to the outermost end of the second conductive layer L2 is less than a distance from the central axis of the substrate 132 to the outermost end of the second insulation layer P2 by a predetermined distance "D". Here, as shown in FIG. 9, the central axis penetrates the center of the circular substrate 132. The substrate 132 may have a polygonal shape such as a triangle or a quadrangle and the like as well as a circle shown in FIG. 9.

As such, when a distance from the central axis of the substrate 132 to the outermost end of the second conductive layer L2 is less than a distance from the central axis of the substrate 132 to the outermost end of the second insulation layer P2, the second conductive layer L2 becomes further from the inner peripheral surface formed by the second receiving groove 152 of the heat radiating body 150, so that it is possible to prevent electric shock between the heat radiating body 150 and the substrate 132. As a result, a withstand voltage of the lighting device 1 can be improved.

A solder mask S is formed on both the first conductive layer L1 except areas on which the plurality of the light emitting devices 131 are disposed and the first insulation layer P1 except areas on which the first conductive layer L1 is disposed.

In addition, the solder mask S is formed on the second insulation layer P2 except areas on which the second conductive layer L2 is disposed. The solder mask S is required to have a white based color in order to easily reflect light emitted from the plurality of the light emitting devices 131.

Figure 48:
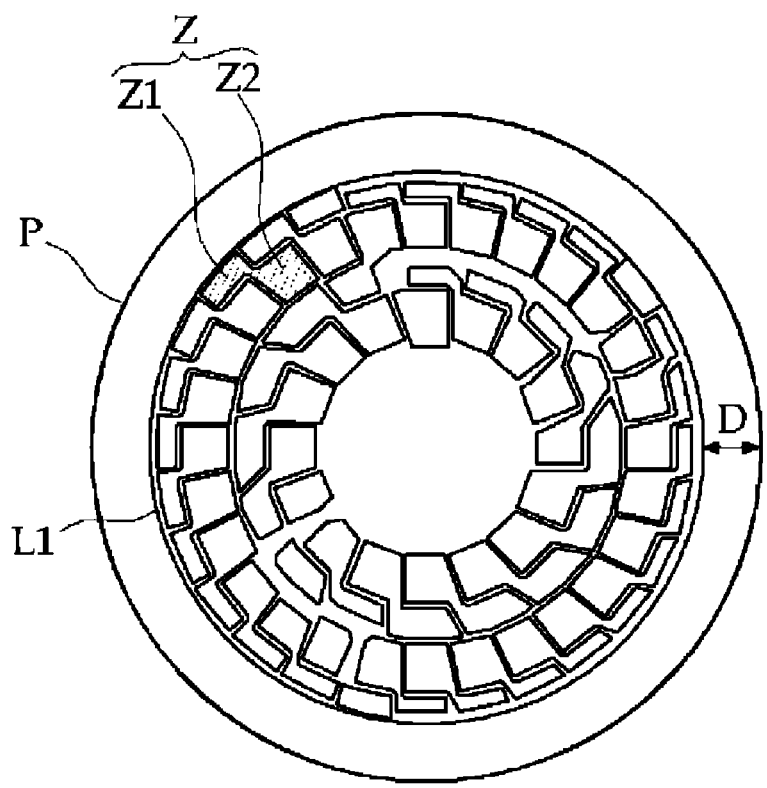
FIG. 48 is a view for describing a shape of a first conductive layer.

FIG. 48 is a view for describing the shape of the first conductive layer L1 shown in FIG. 47.

Referring to FIG. 48, the first conductive layer L1 is divided in advance into zones Z on which a plurality of the light emitting devices 131 are disposed respectively. The zones Z on which the plurality of the light emitting devices 131 are to be disposed are composed of a first rectangular zone Z1 and a second lozenge-shaped zone Z2. In the zones Z1 and X2, it is the zone Z2 that the plurality of the light emitting devices 131 are disposed on.

As described above, a distance from the central axis of the substrate 132 to the outermost end of the first conductive layer L1 is less than a distance from the central axis of the substrate 132 to the outermost end of the first insulation layer P1 by a predetermined distance "D". Here, the predetermined distance "D" is required to be at least 5 mm.

The following table 1 shows withstand voltage characteristic experimental data according to the predetermined distance "D".

TABLE 1

| D | withstand voltage characteristic result |
| --- | --- |
| 1 mm | FAIL at 2.0 KV |
| 5 mm | PASS at 4.0 KV |

In experimental data of Table 1, it is premised that the lighting device 1 of the present invention has a power of 15 watts (W), the light emitting module substrate 132 has a size of 69 $\phi$, the pad of the heat radiating body 150 has a size of 70 $\phi$, the pad of the heat radiating body 150 has a thickness of 0.4 mm, the through hole 153 has a size of 15 $\phi$, and only the predetermined distance "D" is changed. During the experiment, high voltage (the maximum voltage is 4.0 KV) and high current (the maximum current is 100 mA) are applied for one minute to the wiring line 165 connected to the heat radiating body 150 and the light emitting module substrate 132. If the aforesaid condition is overcome, the withstand voltage characteristic is determined to be satisfactory.

The experimental results are as follows. When the predetermined distance "D" is 1 mm, the heat radiating body 150 is electrically short-circuited at 2.0 KV with the light emitting module substrate 132 so that the withstand voltage characteristic is not satisfied (FAIL). However, when the predetermined distance "D" is 5 mm, it can be discovered that the heat radiating body 150 is not electrically short-circuited at 4.0 KV with the light emitting module substrate 132 (PASS).

Therefore, the first conductive layer L1 and the second conductive layer L2 are required to be spaced apart by a distance of at least 5 mm from the outermost ends of the first insulation layer P1 and the second insulation layer P2.

Accordingly, as shown in FIGS. 47 and 48, when the heat radiating body 150 is electrically connected through the via H to the first to the fourth conductive layers L1 to L4 of the substrate 132, light emitted from the plurality of the light emitting devices 131 can be easily transferred to the heat radiating body 150. Moreover, since the sizes of the first and the second conductive layers L1 and L2 are smaller than those of other layers, it is possible to prevent electric shock between the heat radiating body 150 and the substrate 132, and to improve the withstand voltage.

Figure 49:
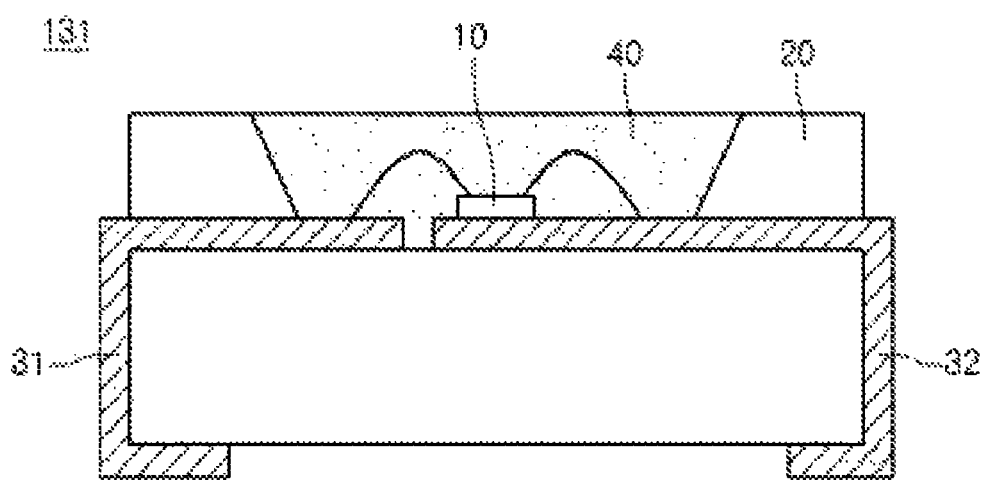
FIG. 49 is a cross sectional side view of a light emitting device mounted on the lighting device.

FIG. 49 is a cross sectional side view of the light emitting device 131 mounted on the lighting device 1 according to the embodiment.

Referring to FIG. 49, the light emitting device 131 includes a body 20, a first electrode layer 31 and a second electrode layer 32 which are disposed on the body 20, and a light emitting chip 10 which is disposed on one of the body 20, the first electrode layer 31 and the second electrode layer 32 and is electrically connected to the first electrode layer 31 and the second electrode layer 32 and emits light.

The body 20 is formed of at least one of a resin material like polyphthalamide (PPA), S1, a metallic material, photo sensitive glass (PSG), Al2O3 and PCB.

The top surface of the body 20 may have various shapes such as a quadrangle, a polygon and a circle and the like according to the use and design of the light emitting device 131.

A cavity may be formed to open the upper part of the body 20. The cavity may have a shape of a cup and a concave vessel and the like. The inner surface of the cavity may be vertical to the ground or inclined. The shape of the cavity as viewed from the top may be a circle, a quadrangle, a polygon and an ellipse and the like.

The first electrode layer 31 and the second electrode layer 32 are electrically separated from each other and disposed on the body 20. The first electrode layer 31 and the second electrode layer 32 are electrically connected to the light emitting chip 10 so that electric power can be supplied to the light emitting chip 10.

The first electrode layer 31 and the second electrode layer 32 may include a metallic material, for example, at least one of Ti, Cu, Ni, Au, Cr, Ta, Pt, Sn, Ag and P. The first electrode layer 31 and the second electrode layer 32 may also have a single layer structure or a multi layer structure. There is no limit to the structures of the first electrode layer 31 and the second electrode layer 32.

One ends of the first electrode layer 31 and the second electrode layer 32 are disposed inside the cavity of the body 20. The other ends of the first electrode layer 31 and the second electrode layer 32 are disposed to be exposed outside the body 20. However, there is no limit to the shapes of the first electrode layer 31 and the second electrode layer 32.

The light emitting chip 10 may be disposed on one of the body 20, the first electrode layer 31 and the second electrode layer 32. The light emitting chip 10 is electrically connected to the first electrode layer 31 and the second electrode layer 32 and is supplied with electric power so that it can emit light. Heat generated from the light emitting chip 10 is transferred to the first electrode layer 31 and the second electrode layer 32 and is radiated to the outside.

The light emitting chip 10 may include at least one light emitting diode (LED). The LED may include a color LED emitting red, green, blue and white light, etc., or ultra violet (UV) LED emitting ultraviolet light. There is no limit to the kind of the LED.

The light emitting chip 10 is, as shown, electrically connected to the first electrode layer 31 and the second electrode layer 32 in a wire bonding manner or in a flip-chip manner and in a die-bonding process and the like.

A seal material 40 may be formed inside the cavity in order to seal and protect the light emitting chip 10. The seal material 40 may include a fluorescent material.

The seal material 40 may be formed of a silicon material or a resin material. The seal material 40 is formed by filling the cavity with the silicon material or the resin material and curing them. However, there is no limit to a method for forming the seal material 40.

The fluorescent material can be added to the seal material 40. The fluorescent material is excited by a first light emitted from the light emitting chip 10 and generates a second light. For example, when the light emitting chip 10 is a blue LED and the fluorescent material is a yellow fluorescent material, the yellow fluorescent material is excited by blue light and emits yellow light. As the blue light is mixed with the yellow light, the light emitting device 131 can provide white light. However, there is no limit to the kind of light provided by the light emitting device 131.

The features, structures and effects and the like described in the embodiments are included in at least one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although preferred embodiments of the present invention were described above, theses are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A lighting device comprising:
    a heat radiating body comprising a base, a first body extended downward from the base, a second body extended upward from the base, and a plurality of heat radiating fins extended from the first body and the second body;
    a light source disposed on the base and received in the first body;
    a power supply controller received in the second body and connected electrically to the light source; and
    a guide that allows light radiated from the light source and that is disposed on the first body of the heat radiating body,
    wherein each of the heat radiating fins has a shape of a circular arc bent perpendicular to a longitudinal direction of the heat radiating body, wherein each of the heat radiating fins comprises a first fin extended from the first body and a second fin extended from the second body,
wherein the guide covers the first fins, and
wherein an arc length of the first fin from the first body is less than an arc length of the second fin from the second body.

2. The lighting device of claim 1, wherein the guide comprises:
a base having the opening; and
a cover extended from the base and surrounding the first fins.

3. The lighting device of claim 2, wherein at least one of the base of the guide or the cover has a hole communicated with a space defined by the cover the first fins and the first body.

4. The lighting device of claim 1, further comprising a case surrounding the second body and the guide.

5. A lighting device comprising:
a heat radiating body comprising a base, a first body extended downward from the base and a second body extended upward from the base;
a light source disposed on the base and received in the first body;
an inner case comprising an inner body received in the second body and a guide extended outward from the inner body;
a power supply controller received in the inner body of the inner case and connected electrically to the light source;
an outer case comprising an outer wall surrounding the heat radiating body,
wherein the outer case has a hole communicated with a space formed between the outer wall and the heat radiating body,
wherein the outer case further comprises a plurality of couplers extended from the outer wall and coupled to the guide of the inner case, and wherein the hole is defined by the guide of the inner case, the couplers and the outer wall.

6. The lighting device of claim 5, wherein the hole is disposed at the outer wall.

7. The lighting device of claim 5, wherein the outer case further comprises a guide coupled to the couplers, wherein the guide of the outer case is coupled to the guide of the inner case.

8. The lighting device of claim 5, wherein a distance between the outer wall and the heat radiating body become narrower in a direction from the first body to the second body.

9. The lighting device of claim 8, wherein the heat radiating body further comprises a plurality of heat radiating fins extended from the first body and the second body.

10. The lighting device of claim 9, wherein each of the heat radiating fins has a shape of a circular arc bent perpendicular to a longitudinal direction of the heat radiating body.

11. A lighting device comprising:
a heat radiating body comprising a base, a first body extended downward from the base and a second body extended upward from the base;
a substrate disposed on the base and received in the first body;
a plurality of light emitting devices disposed on the substrate;
a sealing ring received in the first body and disposed between an edge part of the substrate and the first body; and
a guide that covers the first body of the heat radiating body,
wherein the guide supports the sealing ring in order to fix the substrate to the base of heat radiating body,
wherein the sealing ring is made of an electrical insulating material, and
wherein the sealing ring electrically insulates the substrate from the first body.

12. The lighting device of claim 11, further comprising a lens disposed between the sealing ring and the guide.

13. The lighting device of claim 11, wherein the sealing ring comprises a sloped surface reflecting lights from the light emitting devices.

14. The lighting device of claim 11, wherein a first width of the first body is less than a second width of the second body.

15. The lighting device of claim 11, further comprising a power supply controller received in the second body and connected electrically to the substrate using a wire,
wherein the base of the heat radiating body has a hole in which the wire is disposed, and
wherein the heat radiating body further comprises a supporter that supports the power supply controller.

16. The lighting device of claim 15, wherein the supporter is disposed on the base, wherein the supporter is spaced apart from the hole by a greater distance than a diameter of the hole.

17. The lighting device of claim 1, wherein the first body and the second body have a cylindrical shape.

18. The lighting device of claim 17, wherein a diameter of the second body is greater than a diameter of the first body.

19. The lighting device of claim 1, wherein the first body has a cylindrical shape, and wherein the second body has a truncated cone shape.

* * * * *